(12) United States Patent
Zang

(10) Patent No.: US 12,419,125 B2
(45) Date of Patent: Sep. 16, 2025

(54) CMOS DEVICES WITH ASYMMETRICALLY PASSIVATED ISOLATION STRUCTURE AND METHODS THEREOF

(71) Applicant: OMNIVISION TECHNOLOGIES, INC., Santa Clara, CA (US)

(72) Inventor: Hui Zang, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 421 days.

(21) Appl. No.: 17/975,165

(22) Filed: Oct. 27, 2022

(65) Prior Publication Data

US 2024/0145512 A1    May 2, 2024

(51) Int. Cl.
H10F 39/00         (2025.01)
H10F 39/18         (2025.01)

(52) U.S. Cl.
CPC ......... H10F 39/807 (2025.01); H10F 39/014 (2025.01); H10F 39/182 (2025.01); H10F 39/80373 (2025.01)

(58) Field of Classification Search
CPC .... H10F 39/807; H10F 39/014; H10F 39/182; H10F 39/80373; H10F 39/18; H10F 39/802; H10F 39/80377
See application file for complete search history.

(56) References Cited

U.S. PATENT DOCUMENTS 7,919,797 B2    4/2011  Rhodes et al.
9,947,701 B2    4/2018  Liang et al.
2023/0215900 A1*  7/2023  Wang ............... H10F 39/014
                                                 257/292
2023/0223412 A1*  7/2023  Guidash ........... H10F 39/014
                                                 348/308
2024/0030258 A1*  1/2024  Cheng .............. H10F 39/807
2024/0047487 A1*  2/2024  Hsieh .............. H10F 39/8033
2024/0055445 A1*  2/2024  Goto ............... H10F 39/80373
2024/0055458 A1*  2/2024  Kim ................ H10F 39/199

OTHER PUBLICATIONS

Sun et al., Backside passivation for improving the noise performance in CMOS image sensor, AIP Advances 10, 045229; https://doi.org/10/1063/5.0006700, Apr. 23, 2020, 6 pages.

* cited by examiner

*Primary Examiner* — Mohsen Ahmadi
(74) *Attorney, Agent, or Firm* — Christensen O'Connor Johnson Kindness PLLC

(57) ABSTRACT

A pixel for an image sensor is described. The pixel comprises a photodiode and an isolation structure disposed within a semiconductor substrate and between a first and second side of the semiconductor substrate. The isolation structure includes a bottom sidewall coupled to a first sidewall and a second sidewall of the isolation structure. The isolation structure is disposed, at least in part, between a gate electrode and the second side of the semiconductor substrate. A first implant region of the semiconductor substrate is disposed proximate to the first sidewall of the isolation structure. The first implant region is disposed between the photodiode and the first sidewall. A first dopant concentration of the first implant region is greater than a bulk dopant concentration of the semiconductor substrate.

24 Claims, 9 Drawing Sheets

CMOS DEVICES WITH ASYMMETRICALLY PASSIVATED ISOLATION STRUCTURE AND METHODS THEREOF

TECHNICAL FIELD

This disclosure relates generally to complementary metal-oxide semiconductor devices, and in particular but not exclusively, relates to CMOS image sensors.

BACKGROUND INFORMATION

Image sensors are a type of complementary metal-oxide semiconductor device that have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is readout as analog image signals from the column bit lines and converted to digital values to produce digital images (i.e., image data) representative of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1A:
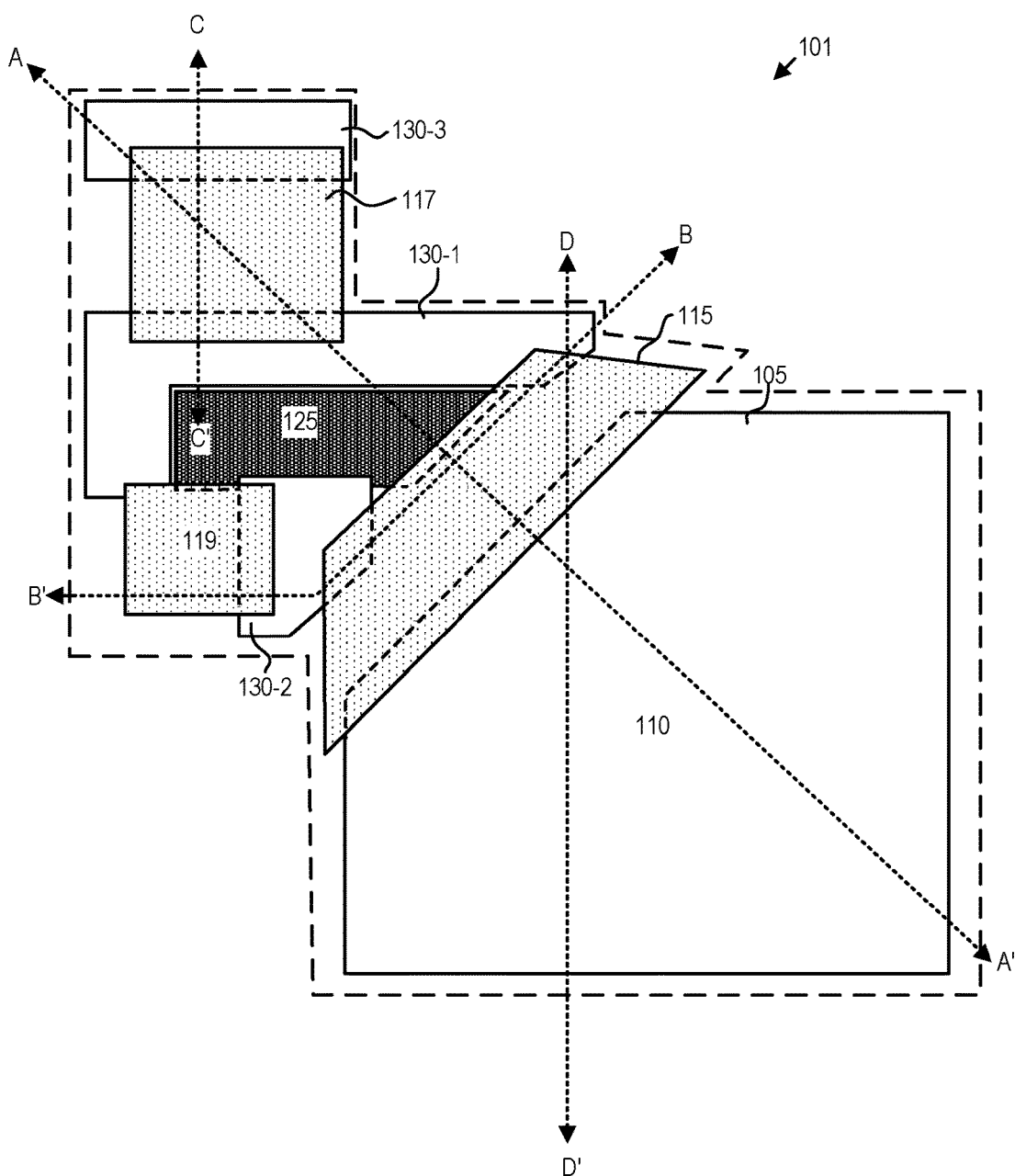
FIG. 1A illustrates a top view of an example pixel included in an image sensor with an asymmetrically passivated isolation structure, in accordance with embodiments of the present disclosure.

Embodiments of an apparatus, system, and method each related to complementary metal-oxide semiconductor (CMOS) devices with one or more asymmetrically passivated isolation structures are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

It is appreciated that the formation of isolation structures (e.g., shallow trench isolation structures, deep trench isolation structures, or other structures that result in the removal of one or more portions of a semiconductor substrate that are subsequently backfilled with the same or a different material or are otherwise incorporated to electrically and/or optically isolation individual components) may result in defects that could negatively affect performance of semiconductor devices such as image sensors. For example, as pixels included in image sensors decrease in size (e.g., as manufacturing processes improve to allow for smaller feature sizes, space utilization efficiency increases, or the like), the influence of defects or traps introduced by the formation of isolation structures (such as plasma etching for trench formation) may result in increased dark current and white pixel noise, which is a key metric in characterizing image sensors and associated with pixel generated current while the image sensor is not exposed to light. Accordingly, reduced white pixels may result in an increased signal to noise ratio and thus higher dynamic range of the image sensor.

To passivate the defects and/or traps introduced by the formation of isolation structures, ion implantation may be utilized to dope regions of the semiconductor substrate proximate to the isolation structures. However, it was found that such passivation could negatively affect random noise, threshold voltage control of adjacent or nearby pixel transistors (e.g., source-follower transistor, reset transistor, dual floating diffusion transistor, or any other transistor proximate to an isolation structure that has been passivated), and potentially lower full well capacity. In other words, the passivation of defects/traps could both positively and negatively affect semiconductor device performance.

It was found that by forming an asymmetric doping profile around or otherwise proximate to isolation structures, white pixel noise may be reduced while mitigating the negative consequences from the passivation. The asymmetric doping profile enables selectively doping regions of the semiconductor substrate with different implantation dosages dependent on their relative location to other elements of the semiconductor device. For example, regions of the semiconductor substrate proximate to both sidewalls of an isolation structure and a floating diffusion region or photodiode can be doped with a higher dosage (e.g., to passivate defects/trap sites), while other regions of the semiconductor substrate that are proximate to both sidewalls of an isolation structure and a gate electrode of a transistor can be doped with a lower concentration (e.g., to mitigate the increase in random noise and/or control threshold voltage) or not doped at all. Additionally, the doping may surround the isolation structure such that both sidewalls and bottom surfaces of the isolation structure may be passivated to enhance performance of the semiconductor device more effectively. Accordingly, an asymmetric doping profile may extend around one or more isolation structures to advantageously reduce white pixel noise, mitigate an increase in noise, mitigate any reduction in full well capacity, and control threshold voltage of transistors, which can improve semiconductor device (e.g., image sensors) performance. It is appreciated that while embodiments of the disclosure will be discussed in the context of pixels and/or image sensors, such embodiments are non-limiting and that in other embodiments the asymmetric doping profile described herein may advantageously be used for devices other than pixels and/or image sensors. It is further appreciated that in many embodiments, an asymmetric doping profile may be formed by implant regions with different doping concentrations that are disposed on or otherwise proximate to opposite sides of a given isolation structure. However, in accordance with the teachings of the present disclosure, the implant regions may not necessarily be directly opposite of one another. Rather, depending on a configuration of the pixel (e.g., the pixel layout, which describes the relative orientation and shapes of the photodiode, floating diffusion region, isolation structure, and/or gate electrodes) and/or the cross-sectional plane through which the structure is viewed, the implant regions with different doping concentrations may be positioned relative to one another and with respect to the isolation structure in different configurations (e.g., in some embodiments, the implant regions with different doping concentrations may be positioned proximate to adjacent sides of a given isolation structure).

FIG. 1A illustrates a top view 100 of an example pixel 101 included in an image sensor with an asymmetrically passivated isolation structure, in accordance with embodiments of the present disclosure. The example pixel 101 includes a semiconductor substrate 105, a photodiode 110, a transfer gate electrode 115 of a transfer transistor, a source-follower gate electrode 117 of a source-follower transistor, a reset gate electrode 119 of a reset transistor, floating diffusion region 125, and isolation structures 130, including isolation structure 130-1, isolation structure 130-2, and isolation structure 130-3. In embodiments of the disclosure, the semiconductor substrate 105 includes or is otherwise formed of silicon, a silicon germanium alloy, germanium, a silicon carbide alloy, an indium gallium arsenide alloy, any other alloys formed of III-V group compounds, combinations thereof, or a bulk substrate thereof. In some embodiments, the semiconductor substrate 105 is an intrinsic semiconductor (e.g., undoped) while in other embodiments, the semiconductor substrate 105 is an extrinsic semiconductor (e.g., the semiconductor substrate 105 is a p-type or an n-type semiconductor, where "p" and "n" indicate a conductivity type of the semiconductor substrate 105). In some embodiments, the semiconductor substrate 105 includes an epitaxial layer grown thereon for photodiode 110 to be formed therein. In one or more embodiments, the semiconductor substrate 105 may be described as having a bulk dopant concentration, which corresponds to a background or baseline doping characteristic of the semiconductor substrate 105 (e.g., the bulk dopant concentration may describe the baseline intrinsic or extrinsic doping characteristics). In the same or other embodiments, the bulk doping concentration may correspond to the dopant concentration of the epitaxial layer grown on the semiconductor substrate 105. It is further appreciated that the term "semiconductor substrate" throughout the disclosure may correspond to a part of or an entirety of a semiconductor wafer (e.g., formed of one or more of the aforementioned materials). The photodiode 110 is a photosensitive element (e.g., a pinned photodiode) comprising one or more doped regions of the semiconductor substrate 105 that collectively and/or in combination with the semiconductor substrate 105 form a PN junction within the semiconductor substrate 105 capable of photogenerating charge carriers responsive to an intensity of light incident upon the photodiode 110. As illustrated, the photodiode 110 of the pixel 101 has a shape corresponding to a square with a corner removed (i.e., a regular polygon with five sides). However, in the same or other embodiments, the photodiode 110 (or other instances thereof) may assume rectangular, triangular, trapezoidal, pentagonal, hexagonal, heptagonal, octagonal, rhomboid, or the shapes such as regular or irregular polygons.

The transfer gate electrode 115, the source-follower gate electrode 117, and the reset gate electrode 119 respectively form the transfer transistor, the source-follower transistor, and the reset transistor of the pixel 101 for reading out the photogenerated charge carriers generated by the photodiode 110 in response to incident light. In one embodiment, the transfer gate 115 is coupled to transfer the accumulated photogenerated charge carriers within the photodiode 110 to the floating diffusion region 125. In the same or another embodiment, the reset gate is coupled to reset the floating diffusion region 125 and/or the photodiode 110 (e.g., to a pre-determined charge level or voltage) while the source-follower gate 117 is coupled to amplify the charge accumulated in the floating diffusion region 125 and outputting a voltage indicative of the amplified charge. It is appreciated that in the illustrated embodiment, the transfer gate electrode 115, the source-follower gate electrode 117, and the reset gate electrode 119 may be utilized to operate the pixel 101 similar to a 4T pixel. It is further appreciated that not all gate electrodes included in the pixel 101 are necessarily illustrated. For example, the pixel 101 may include additional gate electrodes for a row select transistors, transistors included in conversion gain circuitry (e.g., dual floating diffusion), transistors coupled to memory elements, and other transistors (e.g., for 3T, 5T, 6T, or other higher transistor count pixel architectures). In some embodiments, the gate electrodes (e.g., the transfer gate electrode 115, the source-follower gate electrode 117, the reset gate electrode 119, or other gate electrodes included in the pixel 101) may be formed of polycrystalline silicon (extrinsic or intrinsic), metal (e.g., one or more of Al, Cu, Au, Ag, Ti, Ta, Nb), metal alloys (e.g., TaN, $WN_x$, other metal nitrides, $RuO_x$, or other metal oxide gate electrode materials), or combinations thereof.

Disposed proximate to the gate electrodes (e.g., the transfer gate electrode 115, the source-follower gate electrode 117, and the reset gate electrode 119) of the pixel 101 are the isolation structures 130, which may be one or more interconnected or physically distinct and separated structures positioned to electrically and/or optically isolate adjacent elements included in the pixel 101 (e.g., the isolation structure 130-1 is shaped and positioned to isolate the floating diffusion region 125 from the source-follower gate electrode 117). As illustrated in FIG. 1A, the isolation structure 130-1, the isolation structure 130-2, and the isolation structure 130-3 are distinct and separate isolation structures. However, in other embodiments, the isolation structure 130-1, the isolation structure 130-2, and the isolation structure 130-3 extend from each other or are otherwise coupled together to form a monolithic isolation structure. Accordingly, and in some embodiments, reference to one of the isolation structure 130-1, the isolation structure 130-2, or the isolation structure 130-3, may correspond to a portion of a larger monolithic isolation structure included in the pixel 101. The isolation structures 130 may be shallow trench isolation structures or deep trench isolation structures. In most embodiments, the isolation structures 130 correspond to shallow trench isolation structures. In some embodiments, the isolation structures 130 may be formed from a trench filled with a dielectric material, or otherwise include silicon dioxide, other dielectric materials (e.g., $HfO_2$, or other insulating materials having a dielectric constant greater than a corresponding dielectric constant of silicon dioxide), polycrystalline silicon, or combinations thereof.

In the illustrated embodiment, the isolation structure 130-1 is disposed proximate to and below the transfer gate electrode 115 and/or the source-follower gate electrode 117, the isolation structure 130-2 is disposed proximate to and below the transfer gate electrode 115 and the reset gate electrode 119, and the isolation structure 130-3 is disposed proximate to and below the source-follower gate electrode 117, as illustrated in FIGS. 1A-1E. Advantageously, the configuration of the photodiode 110, the gate electrodes (e.g., the transfer gate electrode 115, the source-follower gate electrode 117, the reset gate electrode 119, or other gate electrodes included in the pixel 101), the floating diffusion region 125, and the isolation structures 130 promotes efficient utilization of space within or proximate to the semiconductor substrate 105 (e.g., to increase fill factor of the pixel 101), but the close proximity of certain elements may increase dark current, white pixels, and/or noise. For example, sidewalls of the isolation structures 130 proximate to the photodiode 110 (e.g., sidewalls for portions of the isolation structure 130-1 and the isolation structure 130-2 disposed under the transfer gate electrode 115 or other portions of the isolation structures 130 disposed proximate to the photodiode 110) may have an increased trap density, which may become charged and increase dark current. To mitigate this effect, the sidewalls of trenches utilized to form the isolation structures 130, or more specifically regions of the semiconductor substrate 105 that form the sidewalls of the trenches, may be passivated via implantation of one or more dopants (e.g., B, As, P, other group III or V elements, or combinations thereof). However, it was found that uniform doping of the sidewalls of the isolation structures 130 may negatively affect random noise and unintentionally modulate the threshold voltage of transistors associated with the gate electrodes 130 (e.g., the source-follower transistor associated with the source-follower gate electrode 117 and the reset transistor associated with the rest gate electrode 119 of the pixel 101). This is particularly the case for regions of the semiconductor substrate 105 that are disposed proximate to the isolation structures 130 that are also below gate electrodes (e.g., the source-follower gate electrode 117, the reset gate electrode 119, or other gate electrodes included in the pixel 101). In order to achieve the benefit of trap/defect passivation while reducing random noise, embodiments of the pixel 101 described herein include one or more asymmetric doping profiles for regions of the semiconductor substrate 105 proximate to the isolation structures 130. The one or more asymmetric doping profiles have been developed to balance the benefits of isolation structure passivation that reduce dark current and/or white pixels while simultaneously mitigating the increase in noise associated with isolation structure passivation and further still providing transistor threshold voltage control.

In the following description of FIGS. 1B-1E, which provides additional views of the pixel 101 illustrated in FIG. 1A, implant regions 132 and 134 are discussed. The implant regions 132 and 134 extend from, or are otherwise disposed proximate to, sidewalls of the isolation structures 130 while simultaneously being positioned, at least in part, below one or more gate electrodes (e.g., the transfer gate electrode 115, the source-follower gate electrode 117, the rest gate electrode 119, or other gate electrodes included in the pixel 101). It is appreciated that the implant regions 132 and 134 correspond to regions of the semiconductor substrate 105 that have different dopant concentrations relative to each other (e.g., the dopant concentration of implant regions 132 is greater than the dopant concentration of implant region 134), which may be due to differing implantation dosages. For example, the implant regions 132 may have a dopant concentration that is at least one or two orders of magnitude greater than a corresponding dopant concentration of implant regions 134. In general, the implant regions 132 are positioned to passivate traps present in the semiconductor substrate 105 proximate to the photodiode 110 that arise from the formation of the isolation structures 130 while implant regions 134 are positioned to control the threshold voltage associated with transistors included in the pixel 101 and reduce noise during readout.

In the following views (e.g., 101-AA' of FIG. 1B, 101-BB' of FIG. 1C, 101-CC' of FIG. 1D, and 101-DD' of FIG. 1E), the implant regions 132 and 134 will be suffixed with a number (e.g., 1, 2, or 3) to indicate which one of the isolation structures 130 (e.g., 130-1, 130-2, or 130-3) the implant region extends from and a letter (e.g., A, B, C, D) to indicate which line (e.g., A-A', B-B', C-C', or D-D' illustrated in FIG. 1A) the implant region is associated with. However, it is appreciated that the doping concentration for like labeled implant regions is not necessarily identical (e.g., implant region 132-1A illustrated in FIG. 1B may not necessarily have the exact same dopant concentration as that of implant region 132-1B illustrated in FIG. 1C). Additionally, it is noted that dopant concentration of the implant regions 132 and 134 may not be uniform within a given view (e.g., the dopant concentration of implant region 132-1B illustrated in FIG. 1C is not necessarily identical to the dopant concentration of the implant region 132-1D illustrated in FIG. 1E) due to dopant concentration being correlated to distance. Accordingly, terms like "asymmetric doping profile" correspond to a doping concentration of a given region checked at a common distance from a reference point when being compared (e.g., referring to FIG. 1B, the dopant concentration of implant region 132-1A may be checked at a first distance from sidewall 130-1S1 while the dopant concentration of the implant region 134-1A is checked from a second distance from the sidewall 130-1S2 when the first distance is equal to the second distance). However, it is appreciated that in general the dopant concentration of the implant regions 132 are greater than the dopant concentration of the implant regions 134.

Figure 1B:
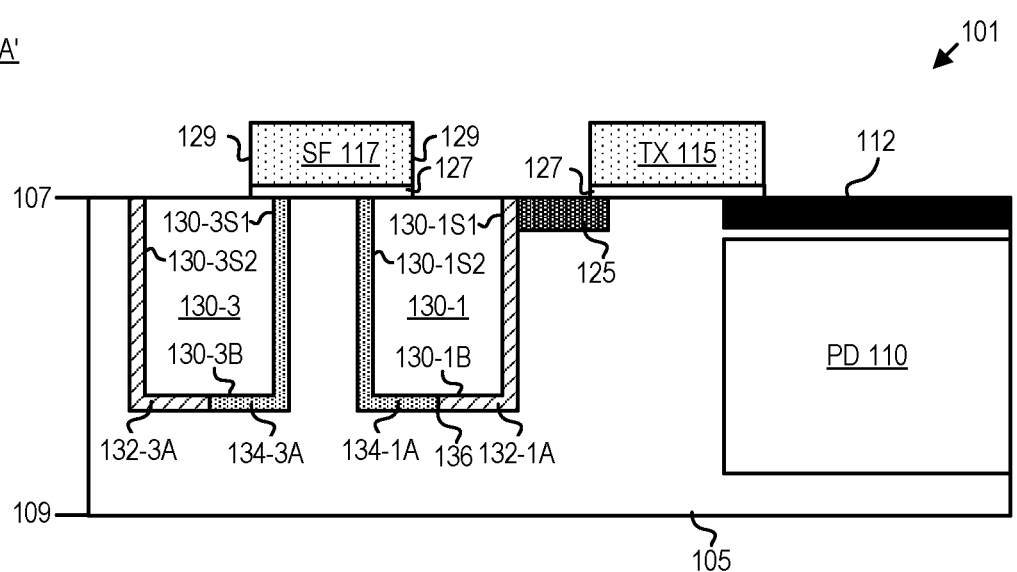
FIG. 1B illustrates a cross-sectional view of the example pixel along line A-A' shown in FIG. 1A, in accordance with embodiments of the present disclosure.
Figure 1C:
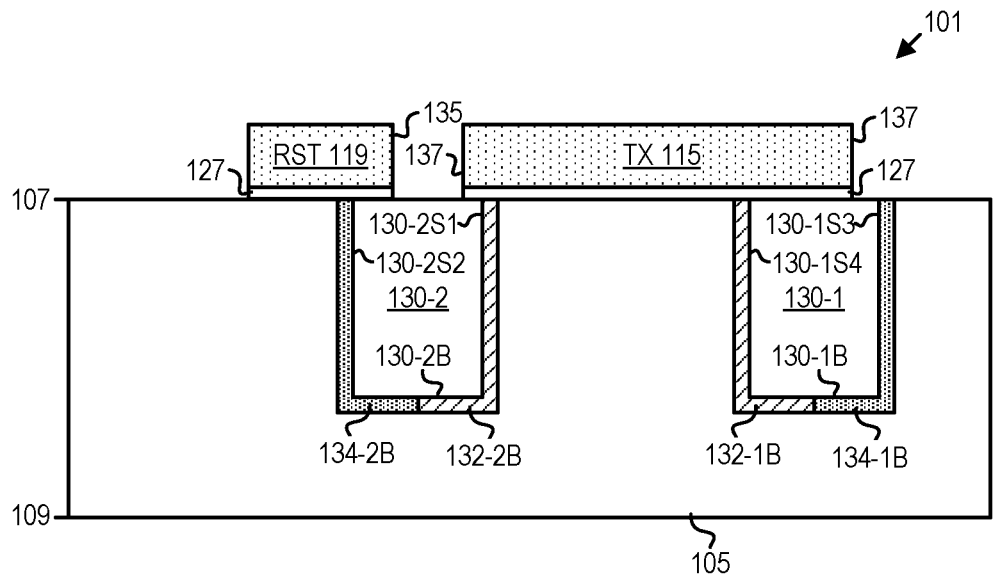
FIG. 1C illustrates a cross-sectional view of the example pixel along line B-B' shown in FIG. 1A, in accordance with embodiments of the present disclosure.

FIG. 1B illustrates a cross-sectional view 101-AA' of the example pixel 101 along line A-A' shown in FIG. 1A, in accordance with embodiments of the present disclosure. As illustrated the semiconductor substrate 105 includes a first side 107 (e.g., a front side or a backside) and a second side 109 (e.g., a backside or a front side) opposite the first side 107. The cross-sectional view 101-AA' further shows the photodiode 110 disposed between the first side 107 and the second side 109 and extending, at least in part, under the transfer gate electrode 115 such that the photodiode 110 is disposed between the transfer gate electrode 115 and the second side 109. The photodiode 110 has a first conductivity type (e.g., p-type or n-type) opposite of the conductivity type of the semiconductor substrate 105 (e.g., n-type or p-type) and/or a corresponding conductivity type of a well (not illustrated) formed in the semiconductor substrate 105 from which the photodiode 110 resides therein (e.g., in some embodiments the photodiode 110 may be disposed within or otherwise surrounded by a well formed by doping a corresponding region of the semiconductor substrate 105). In the illustrated embodiment, a pinning layer 112 is formed in the semiconductor substrate 105 between the first side 107 of the semiconductor substrate 105 and photodiode 110 to collectively (i.e., the pinning layer 112 in combination with the photodiode 110 and/or one or more wells formed within the semiconductor substrate 105) form a pinned photodiode.

The illustrated view of FIG. 1B further includes the transfer gate electrode 115, the source-follower gate electrode 117, the floating diffusion region 125, gate dielectrics 127, the isolation structure 130-1, and the isolation structure 130-3. In some embodiments, the gate dielectrics 127 correspond to one or more insulating material for forming transistors included in the pixel 101 (e.g., the transfer transistor associated with the transfer gate electrode 115, the source-follower transistor associated with the source-follower gate electrode 117, the reset transistor associated with the reset gate electrode 119, or any other transistor associated with or otherwise included in the pixel 101 as illustrated in FIG. 1A or described in embodiments of the disclosure). In some embodiments, the gate dielectrics 127 include at least one of silicon dioxide, hafnium oxide, or other dielectric materials. In the illustrated embodiment, the isolation structure 130-1 and the isolation structure 130-3 are surrounded or otherwise disposed proximate to implant regions 132 and 134 (e.g., implant regions 132-1A, 132-3A, 134-1A, and 134-3A) of the semiconductor substrate 105.

In some embodiments, the implant regions 132 and 134 directly contact one or more sidewalls of the isolation structures 130 (e.g., the implant region 132-1A directly contacts sidewall 130-1S1 and the implant region 134-3A directly contacts sidewall 130-3S1). It is appreciated that direct contact may occur due to the manner of fabrication (e.g., as described in FIG. 3) that stems from the ion implantation process. However, in other embodiments and depending on the implantation process (e.g., ion implantation energy), the implant regions 132 and 134 may not directly contact one or more sidewalls of the isolation structures 130. However, it is appreciated that due to the implantation process the implant regions 132 and 134 will be disposed proximate to the one or more sidewalls of the isolation structures 130 through which they are formed (i.e., the implant regions 132 and 134 are formed through sidewalls of trenches that are subsequently filled to form the isolation structures 130 and the aforementioned sidewalls of the trenches become sidewalls of the isolation structures 130 that are disposed proximate to the implant regions 132 and 134). In the same or other embodiments, the implant regions 132 and 134 may interface or otherwise directly contact with one another (e.g., the implant region 132-1A contacts the implant region 134-1A at interface 136). In other embodiments, the implant regions 132 and 134 may not interface with one another. In some embodiments, adjacent implant regions may interface one another (e.g., the implant region 134-1A may interface or otherwise extend to the implant region 134-3A). As illustrated the implant regions 134-1A and 134-3A are disposed between the implant regions 132-1A and 132-3A. The implant region 132-1A is disposed between the implant region 134-1A and the floating diffusion region 125. In some embodiments, the implant region 132-1A extends towards and, in some cases, contacts the floating diffusion region 125.

In some embodiments, the implant regions 132 and 134 may be doped regions (e.g., via ions of B, As, P, other group III or V elements, or combinations thereof) of the semiconductor substrate 105 that have a common conductivity type as the photodiode 110 (e.g., p-type or n-type), which is opposite to a conductivity type of the pinning layer 112 and/or the bulk conductivity type of the semiconductor substrate 105. In one embodiment, the floating diffusion region 125 has a common conductivity type with one or more of the implant regions 132 and 134. In the same or other embodiments, the implant regions 132 and 134 have a common conductivity type. In some embodiments, one or more of the implant regions 132 or 134 may be optional or otherwise omitted. For example, in one embodiment, portions of the semiconductor substrate 105 corresponding to the implant regions 134 may not be doped and instead have a dopant concentration corresponding to that of the bulk characteristic of the semiconductor substrate 105 (i.e., the implant regions 134 have a dopant concentration corresponding to that of the bulk dopant concentration of the semiconductor substrate 105). In either case (e.g., whether the implant regions 134 are doped beyond the bulk dopant concentration of the semiconductor substrate 105 or not), the dopant concentration (e.g., magnitude in terms of atoms/$cm^3$) of the implant regions 132 is greater than the dopant concentration of the implant regions 134 to form an asymmetric doping profile around one or more of the isolation structures 130 (e.g., the isolation structure 130-1, the isolation structure 130-3, or any other isolation structure included in the isolation structures 130 of embodiments of the disclosure that are explicitly illustrated or otherwise described). In some embodiments, the floating diffusion 125 and one of the implant regions 132 or 134 (e.g., 132-1A) have a substantially similar dopant concentration (e.g., within 10%) and conductivity type (e.g., both are p-type or n-type). In other embodiments, the dopant concentration of the floating diffusion region 125 is greater than the dopant concentration of the one or more of the implant regions 132 and 134. It is appreciated that the asymmetric doping profile is attributed to different dosages when performing ion implantation. Thus, in some embodiments, a first implantation dosage for forming the implant regions 132 is at least one order of magnitude, two orders of magnitude, or more than a second implantation dosage for forming the implant regions 134.

As illustrated, one or more of the implant regions 134 (e.g., implant regions 134-1A and 134-3A) are disposed, at least in part, below the source-follower gate electrode 117 (e.g., such that at least one of the implant regions 134 is disposed between the source-follower gate electrode 117 and the second side 109 of the semiconductor substrate 105), which based on dopant type and concentration may be utilized to adjust or mitigate modulation of the threshold voltage for the source-follower transistor associated with the source-follower gate electrode 117, reduce noise, or the like. It is appreciated that the implant regions 134 may be implanted to form under the source-follower gate electrode 117 of the source-follower transistor proximate to the channel region associated with the source-follower transistor to be utilized to adjust or mitigate modulation of the threshold voltage for other transistors included in the pixel 101 (e.g., reset transistor), reduce noise, or the like via dopant concentration adjustment in accordance with embodiments of the disclosure. Disposed between the photodiode 110 and one or more of the isolation structures 130 (e.g., the isolation structure 130-1) is one of the implant regions 132 (e.g., implant region 132-1A), which is positioned to passivate defects or traps that may negatively impact operation of the pixel 101 (e.g., by generating dark current when the traps are charged and/or white pixels). It is appreciated that the proximity of the implant region 132 (e.g., 132-1A) to the floating diffusion region 125 and/or the photodiode 110 (see, e.g., implant regions 132-1B and/or 132-2B of FIG. 1C in view of FIG. 1A) may provide the beneficial effect of passivating trap sites proximate to the isolation structures 130 that would otherwise have an adverse impact to photo-generated charge carriers, increase dark current, or otherwise negatively impact operation and/or performance of the pixel 101.

In the illustrated embodiment, the isolation structure 130-1 and the isolation structure 130-3 are disposed within the semiconductor substrate 105 and extend from the first side 107 towards the second side 109. The source-follower gate electrode 117 is disposed proximate to the first side 107 of the semiconductor substrate 105. The isolation structure 130-1 and the isolation structure 130-3 are disposed, at least in part, between the source-follower gate electrode 117 and the second side 109 of the semiconductor substrate. Contacting, extending from, or otherwise disposed proximate to the isolation structure 130-1 and the isolation structure 130-3 are the implant regions 132 and 134 (e.g., implant regions 132-1A and 134-1A proximate to the isolation structure 130-1 and implant regions 132-3A and 134-3A proximate to the isolation structure 130-3). As illustrated, the isolation structure 130-1 and the isolation structure 130-3 are respectively disposed between edges 129 of the source-follower gate electrode 117 and the second side 109 of the semiconductor substrate 105 such that the source-follower gate electrode 117 does not extend over respective portions of the isolation structure 130-1 and the isolation structure 130-3 (i.e., the source-follower gate electrode 117 does not completely cover the isolation structures 130-1 and 130-3 and further does not extend over at least a portion of the implant regions 132-1A and 132-3A).

The cross-sectional view 101-AA' of FIG. 1B shows respective sidewalls and bottom surfaces included in the isolation structures 130-1 and 130-3. In particular, isolation structure 130-1 includes bottom surface 130-1B, sidewall 130-1S1, and sidewall 130-1S2 while isolation structure 130-3 includes bottom surface 130-3B, sidewall 130-3S1, and sidewall 130-3S2. As illustrated, sidewall 130-1S1 is opposite to sidewall 130-1S2 while the bottom surface 130-1B is coupled to sidewalls 130-1S1 and 130-1S2. Similarly, sidewall 130-3S1 is opposite to sidewall 130-3S2 while the bottom surface 130-3B is coupled to sidewalls 130-3S1 and 130-3S2. In the illustrated view, the implant region 132-1A extends from the sidewall 130-1S1 of the isolation structure 130-1 towards the photodiode 110 and the implant region 134-1A extends from the sidewall 130-1S2 and is disposed further away from the photodiode 110 in comparison to implant region 132-1A. In other words, the implant region 132-1A is disposed between the photodiode 110 and the sidewall 130-1. Additionally, the isolation structures 130-1 and 130-3 are both disposed between the photodiode 110 and the implant region 132-3A. Furthermore, the implant region 132-1A is disposed between the photodiode 110 and the implant region 134-1A.

In some embodiments and as illustrated in FIG. 1B, the implant region 132-1A contacts both the sidewall 130-1S1 and the bottom surface 130-1B of the isolation structure 130-1 without contacting the sidewall 130-1S2 of the isolation structure 130-1. The implant region 134-1A contacts both the sidewall 130-1S2 and the bottom surface 130-1B of the isolation structure 130-1 without contacting the sidewall 130-1S1 of the isolation structure 130-1. Accordingly, the bottom surface 130-1B is disposed between the first side 107 of the semiconductor substrate 105 and both of the implant regions 132-1A and 134-1A. Similarly, the implant region 132-3A contacts both the sidewall 130-3S2 and the bottom surface 130-3B of the isolation structure 130-3 without contacting the sidewall 130-3S1 of the isolation structure 130-3. The implant region 134-3A contacts both the sidewall 130-3S1 and the bottom surface 130-3B of the isolation structure 130-3 without contacting the sidewall 130-3S2 of the isolation structure 130-3. Accordingly, the bottom surface 130-3B is disposed between the first side 107 of the semiconductor substrate 105 and both of the implant regions 132-3A and 134-3A. In some embodiments, the implant regions 134-1A and 134-3A, which are formed or positioned respectively opposite implant regions 132-1A and 132-3A in the semiconductor substrate 105, have respective dopant concentrations corresponding to the bulk dopant concentration of the semiconductor substrate 105. In other embodiments, the implant regions 134-1A and 134-3A have respective dopant concentrations greater than the bulk dopant concentration of the semiconductor substrate 105 but less than corresponding dopant concentrations of the implant regions 132-1A and 132-3A. It is appreciated that the asymmetric doping profile attributed, at least in part, to the difference in dopant concentration between the implant regions 132 and 134 provides the benefit of passivating one or more regions of the semiconductor substrate 105 proximate to the isolation structures 130 (e.g., to mitigate the impact of traps or other defects) while also enabling threshold voltage control of one or more transistors and mitigating an increase in noise.

FIG. 1C illustrates a cross-sectional view 101-BB' of the example pixel 101 along line B-B' shown in FIG. 1A, in accordance with embodiments of the present disclosure.

Specifically, the cross-sectional view 101-BB' of FIG. 1C when viewed in the context of FIG. 1A, shows that regions of the isolation structures 130 (e.g., 130-1 and 130-2) proximate to the photodiode 110 (e.g., where defects or traps may have been introduced due to the fabrication of the isolation structures 130) are passivated by one or more implant regions (e.g., 132-1B and 132-2B illustrated in FIG. 1C). Specifically, one or more regions of the semiconductor substrate 105 disposed between the photodiode 110 and the isolation structures 130 are doped to form implant regions (e.g., implant regions 132-1B and 132-2B illustrated in FIG. 1C) of the semiconductor substrate 105. As illustrated, the implant regions 132-1B and 132-2B extend from respective sidewalls of the isolation structures 130 (e.g., 130-1S4 and 130-2S1, respectively) towards the photodiode 110 when FIG. 1C is viewed in the context of FIG. 1A. In other words, the implant regions 132-1B and 132-2B are disposed between the photodiode 110 and corresponding sidewalls of the isolation structures 130 (i.e., 130-1S4 and 130-2S1, respectively).

In the illustrated embodiment of FIG. 1C, the isolation structure 130-1 and the isolation structure 130-2 are disposed within the semiconductor substrate 105 and extend from the first side 107 towards the second side 109. The transfer gate electrode 115 and the reset gate electrode 119 are disposed proximate to the first side 107 of the semiconductor substrate 105. In the illustrated view, the isolation structure 130-1 and the isolation structure 130-2 are both disposed between the transfer gate electrode 115 and the second side of 109 of the semiconductor substrate 105 while the isolation structure 130-2 is further disposed between the reset gate electrode 119 and the second side 109 of the semiconductor substrate 105. Contacting, or otherwise disposed proximate to, the isolation structure 130-1 and the isolation structure 130-2 are the implant regions 132 and 134 (e.g., implant regions 132-1B and 134-1B proximate to the isolation structure 130-1 and implant regions 132-2B and 134-2B proximate to the isolation structure 130-2). As illustrated, the isolation structure 130-1 and the isolation structure 130-2 are disposed between edges 137 of the transfer gate electrode 115 and the second side 109 of the semiconductor substrate 105 such that the transfer gate electrode 115 does not extend over respective portions of the isolation structure 130-1 and the isolation structure 130-2 (i.e., the transfer gate electrode 115 does not completely cover the isolation structures 130-1 and 130-2 and further does not extend over at least portion of the implant regions 134-1A and 134-2B). Similarly, the isolation structure 130-2 is disposed between edge 135 of the reset gate electrode 119 and the second side 109 of the semiconductor substrate 105 such that the reset gate electrode 119 does not extend over respective portions of the isolation structure 130-2 (i.e., the reset gate electrode 119 does not completely cover the isolation structure 130-2 and further does not extend over at least a portion of the implant region 132-2B).

The cross-sectional view 101-BB' of FIG. 1C shows respective sidewalls and bottom surfaces included in the isolation structures 130-1 and 130-2. In particular, isolation structure 130-1 includes bottom surface 130-1B, sidewall 130-1S3, and sidewall 130-1S4 while isolation structure 130-2 includes bottom surface 130-2B, sidewall 130-2S1, and sidewall 130-2S2. As illustrated, bottom surface 130-1B is coupled to sidewalls 130-1S3 and 130-1S4. Similarly, bottom surface 130-2B is coupled to sidewalls 130-2S1 and 130-2S2.

As illustrated, the implant regions 132-1B and 132-2B are formed proximate to respective sidewalls of the isolation structures 130 (e.g., 130-1S4 and 130-2S1, respectively) and under the transfer gate electrode 115 of the transfer transistor associated with the pixel 101. In some embodiments and as illustrated in FIG. 1C, the implant region 132-1B contacts both the sidewall 130-1S4 and the bottom surface 130-1B of the isolation structure 130-1 without contacting the sidewall 130-1S3 of the isolation structure 130-1. The implant region 134-1B is implanted and formed proximate to the sidewall 130-1S3 of the isolation structure 130-1 that is not under the transfer gate electrode 115. The implant region 134-2B is implanted and formed under the reset gate electrode 119 of the reset transistor. The implant region 134-1B contacts both the sidewall 130-1S3 and the bottom surface 130-1B of the isolation structure 130-1 without contacting the sidewall 130-1S4 of the isolation structure 130-1. Accordingly, the bottom surface 130-1B is disposed between the first side 107 of the semiconductor substrate 105 and both of the implant regions 132-1B and 134-1B. Similarly, the implant region 132-2B contacts both the sidewall 130-2S1 and the bottom surface 130-2B of the isolation structure 130-2 without contacting the sidewall 130-2S2 of the isolation structure 130-2. The implant region 134-2B contacts both the sidewall 130-2S2 and the bottom surface 130-2B of the isolation structure 130-2 without contacting the sidewall 130-2S1 of the isolation structure 130-2. Accordingly, the bottom surface 130-2B is disposed between the first side 107 of the semiconductor substrate 105 and both of the implant regions 132-2B and 134-2B. In the illustrated view, the implant regions 134-1B and 134-2B may have respective dopant concentrations corresponding to the bulk dopant concentration of the semiconductor substrate 105. In other embodiments, the implant regions 134-1B and 134-2B have respective dopant concentrations greater than the bulk dopant concentration of the semiconductor substrate 105 but less than corresponding dopant concentrations of the implant regions 132-1B and 134-2B. It is appreciated that an asymmetric doping profile attributed, at least in part, to the difference in dopant concentration between the implant regions 132 and 134 provides the benefit of passivating one or more regions of the semiconductor substrate 105 proximate to the isolation structures 130 (e.g., to mitigate the impact of traps or other defects) while also enabling threshold voltage control of one or more transistors and mitigating an increase in noise.

Figure 1D:
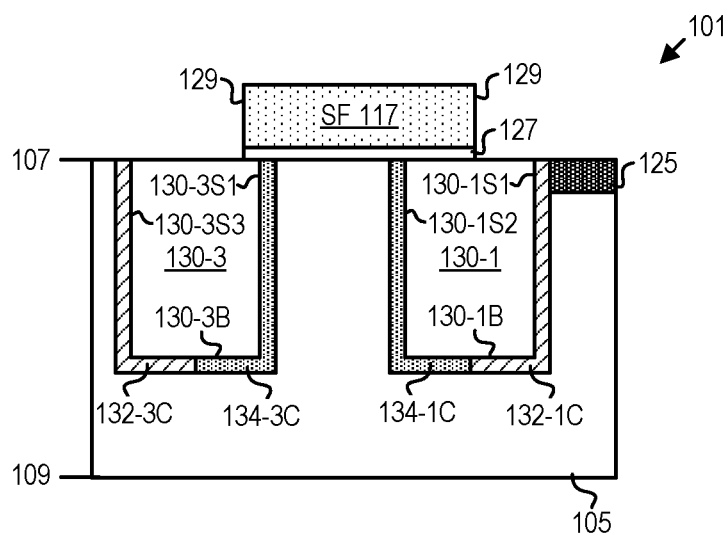
FIG. 1D illustrates a cross-sectional view of the example pixel along line C-C' shown in FIG. 1A, in accordance with embodiments of the present disclosure.

FIG. 1D illustrates a cross-sectional view 101-CC' of the example pixel 101 along line C-C' shown in FIG. 1A, in accordance with embodiments of the present disclosure. Specifically, the cross-sectional view 101-CC' of FIG. 1D when viewed in the context of FIG. 1A, shows that regions of the isolation structures 130 (e.g., 130-1 and 130-3) are disposed below the source-follower gate electrode 117 and/or proximate to the floating diffusion region 125. In the illustrated view of FIG. 1D are implant regions 132-1C, 132-3C, 134-1C, and 134-3C. It is appreciated that implant region 132-1C is disposed between the isolation structure 130-1 and the floating diffusion region 125 (e.g., to passivate defects or traps that may adversely affect readout of image charge from the floating diffusion region 125 while the implant regions 134-1C and 134-3C are disposed proximate to respective sidewalls of isolation structures 130-1 and 130-3 under the source-follower gate electrode 117. The implant regions 134-1C and 134-3C may adjust threshold voltage of the source-follower transistor and/or mitigate an increase in noise during operation of the source-follower transistor). As illustrated, the implant regions 132-1C, 132-3C, 134-1C, and 134-3C extend from respective sidewalls of the isolation structures 130 (e.g., 130-1S1, 130-3S3, 130-

1S2, and 130-3S1 respectively). In the illustrated view, the implant regions 134-1C and 134-3C are disposed between the implant regions 132-1C and 132-3C. Additionally, the bottom surface 130-1B is disposed between the first side 107 of the semiconductor substrate 105 and both of the implant regions 132-1C and 134-1C. Similarly, the bottom surface 130-3B is disposed between the first side 107 of the semiconductor substrate 105 and both of the implant regions 132-3C and 134-3C.

The cross-sectional view 101-CC' of FIG. 1D shows respective sidewalls and bottom surfaces included in the isolation structures 130-1 and 130-3. In particular, isolation structure 130-1 includes bottom surface 130-1B, sidewall 130-1S1, and sidewall 130-1S2 while isolation structure 130-3 includes bottom surface 130-3B, sidewall 130-3S1, and sidewall 130-3S3. As illustrated, the bottom surface 130-1B is coupled to sidewalls 130-1S1 and 130-1S2 and the bottom surface 130-3B is coupled to sidewalls 130-3S1 and 130-3S3. As illustrated, the isolation structure 130-1 and the isolation structure 130-3 are disposed between edges 129 of the source-follower gate electrode 117 and the second side 109 of the semiconductor substrate 105 such that the source-follower gate electrode 117 does not extend over respective portions of the isolation structure 130-1 and the isolation structure 130-3 (i.e., the source-follower gate electrode 117 does not completely cover the isolation structures 130-1 and 130-2 and further does not extend over respective portions of the implant region 132-1C and 132-3C). In some embodiments, the implant regions 134-1C and 134-3C have a respective dopant concentration corresponding to the bulk dopant concentration of the semiconductor substrate 105. In other embodiments, the implant regions 134-1C and 134-3C have respective dopant concentrations greater than the bulk dopant concentration of the semiconductor substrate 105 but less than a corresponding dopant concentration of the implant regions 132-1C and 132-3C. It is appreciated that an asymmetric doping profile attributed, at least in part, to the difference in dopant concentration between the implant regions 132 and 134 provides the benefit of passivating one or more regions of the semiconductor substrate 105 proximate to the isolation structures 130 (e.g., to mitigate the impact of traps or other defects) while also enabling threshold voltage control of one or more transistors and mitigating an increase in noise.

It is appreciated when the isolation structure 130-2 is viewed in the context of at least FIG. 1A and FIG. 1C, it can be seen that the isolation structure 130-2 extends, at least in part, under the transfer gate electrode 115 (i.e., a gate electrode) and the reset gate electrode 119 (i.e., a second gate electrode). Accordingly, an implant region extending from a sidewall of the isolation structure 130-2 (e.g., a first implant region corresponding to 132-2B extending from a first sidewall corresponding to 130-2S1) is disposed between the isolation structure 130-2 and the photodiode 110 (e.g., as shown when FIG. 1C is viewed in the context of FIG. 1A). Furthermore, a second sidewall of the isolation structure 130-2 (e.g., sidewall 130-2S2 illustrated in FIG. 1C) is disposed between the reset gate electrode 119 and the second side 109 of the semiconductor substrate 105.

Figure 1E:
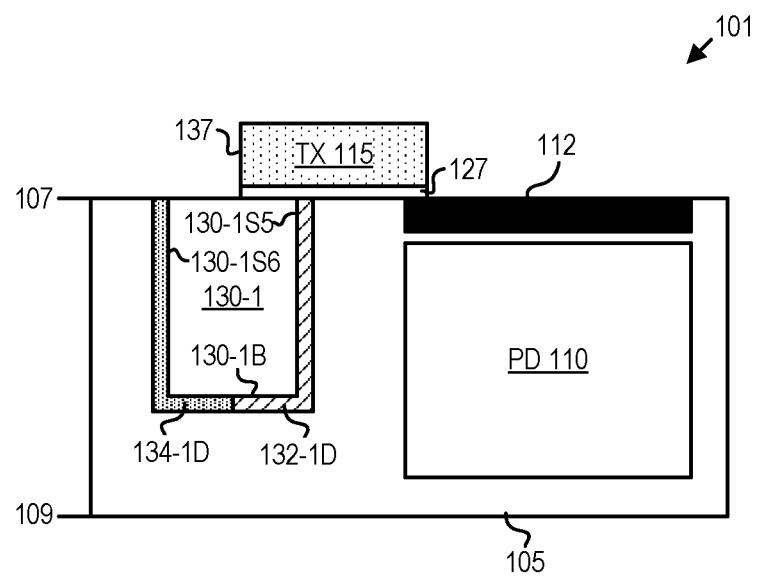
FIG. 1E illustrates a cross-sectional view of the example pixel along line D-D' shown in FIG. 1A, in accordance with embodiments of the present disclosure.

FIG. 1E illustrates a cross-sectional view 101-DD' of the example pixel 101 along line D-D' shown in FIG. 1A, in accordance with embodiments of the present disclosure. Specifically, the cross-sectional view 101-DD' of FIG. 1E when viewed in the context of FIG. 1A, shows that regions of the isolation structures 130-1 proximate to the photodiode 110 (e.g., where defects or traps may have been introduced due to the fabrication of the isolation structure 130-1) are passivated by one or more implant regions (e.g., 132-1 illustrated in FIG. 1E). One or more regions of the semiconductor substrate 105 disposed between the photodiode 110 and the isolation structure 130-1 are doped to form implant regions (e.g., implant region 132-1D illustrated in FIG. 1E) of the semiconductor substrate 105. As illustrated, the implant region 132-1D extends from sidewall 130-1S5 of the isolation structure 130-1 towards the photodiode 110 and the implant region 134-1D extends from sidewall 130-1S6 of the isolation structure 130-1 and disposed further away from the photodiode region of the photodiode 110.

In the illustrated embodiment, the isolation structure 130-1 is disposed within the semiconductor substrate 105 and extends from the first side 107 towards the second side 109. The transfer gate electrode 115 is disposed proximate to the first side 107 of the semiconductor substrate 105. In the illustrated view, the isolation structure 130-1 is disposed between the transfer gate electrode 115 and the second side of 109 of the semiconductor substrate 105. Contacting, or otherwise disposed proximate to, the isolation structure 130-1 are the implant regions 132 and 134 (e.g., implant regions 132-1D and 134-1D proximate to the isolation structure 130-1). As illustrated, the isolation structure 130-1 is disposed between one of the edges 137 of the transfer gate electrode 115 and the second side 109 of the semiconductor substrate 105 such that the transfer gate electrode 115 does not extend over a portion of the isolation structure 130-1 (i.e., the transfer gate electrode 115 does not completely cover the isolation structures 130-1 and further does not extend over at least a portion of the implant region 134-1D).

The cross-sectional view 101-DD' of FIG. 1E shows respective sidewalls and bottom surfaces included in the isolation structure 130-1. In particular, isolation structure 130-1 includes bottom surface 130-1B, sidewall 130-1S5, and sidewall 130-1S6. As illustrated, sidewall 130-1S5 is opposite to sidewall 130-1S6 while the bottom surface 130-1B is coupled to sidewalls 130-1S55 and 130-1S6. Similarly, sidewall 130-3S1 is opposite to sidewall 130-3S2 while the bottom surface 130-3B is coupled to sidewalls 130-3S1 and 130-3S2.

In some embodiments and as illustrated in FIG. 1E, the implant region 132-1D contacts both the sidewall 130-1S5 and the bottom surface 130-1B of the isolation structure 130-1 without contacting the opposite sidewall (e.g., sidewall 130-1S6) of the isolation structure 130-1. The implant region 134-1D contacts both the sidewall 130-1S6 and the bottom surface 130-1B of the isolation structure 130-1 without contacting the opposite sidewall (e.g., sidewall 130-1S5) of the isolation structure 130-1. Accordingly, the bottom surface 130-1B is disposed between the first side 107 of the semiconductor substrate 105 and both of the implant regions 132-1D and 134-1D. In some embodiments, the implant regions 134-1D, which is disposed on sidewall (e.g., sidewall 130-1S6) of the isolation structure 130-1 opposite to implant region 132-1D in the illustrated view, has a respective dopant concentration corresponding to the bulk dopant concentration of the semiconductor substrate 105. In other embodiments, the implant regions 134-1D has a respective dopant concentration greater than the bulk dopant concentration of the semiconductor substrate 105 but less than a corresponding dopant concentration of the implant region 132-1D. It is appreciated that an asymmetric doping profile attributed, at least in part, to the difference in dopant concentration between the implant regions 132 and 134 provides the benefit of passivating one or more regions of the semiconductor substrate 105 proximate to the isolation structures 130 (e.g., to mitigate the impact of traps or other defects) while also enabling threshold voltage control of one or more transistors and mitigating an increase in noise.

It is further appreciated that additional details of embodiments of the disclosure can be inferred when considering the context provided by multiple views disclosed herein. For example, it is appreciated when the isolation structure 130-1 is viewed in the context of at least FIG. 1A, FIG. 1B, and FIG. 1E, it can be seen that the isolation structure 130-1 extends, at least in part, under the transfer gate electrode 115 (i.e., a gate electrode) and the source-follower gate electrode 117 (i.e., a second gate electrode). Accordingly, an implant region extending from a sidewall of the isolation structure 130-1 (e.g., a first implant region corresponding to 132-1D extending from a first sidewall corresponding to 130-1S5 illustrated in FIG. 1E) is disposed between the isolation structure 130-1 and the photodiode 110. Furthermore, another sidewall of the isolation structure 130-1 (e.g., a second sidewall corresponding to the sidewall 130-1S2 illustrated in FIG. 1B) is disposed between the source-follower gate electrode 117 and the second side 109 of the semiconductor substrate 105. Additionally, the isolation structure 130-1 is disposed between the photodiode 110 and the isolation structure 130-3 (i.e., a second isolation structure). Consequently, a sidewall of the isolation structure 130-1 (e.g., the second sidewall corresponding to sidewall 130-1S2 illustrated in FIG. 1B) is disposed between a sidewall of the isolation structure 130-3 (e.g., a third sidewall of the second isolation structure corresponding to sidewall 130-3S1 illustrated in FIG. 1B) and the implant region (e.g., the first implant region corresponding to the implant region 132-1D extending from the first sidewall 130-1S5 illustrated in FIG. 1E). As illustrated in FIG. 1B, the sidewall of the isolation structure 130-3 (e.g., the third sidewall) is disposed between the source-follower gate electrode 117 (i.e., the second gate electrode) and the second side 109 of the semiconductor substrate 105. It is appreciated that additional implant regions (e.g., one or more second implant regions corresponding to implant regions 134-1A and 134-3A illustrated in FIG. 1B) are disposed between the source-follower gate electrode 117 (i.e., the second gate electrode) and the second side 109 of the semiconductor substrate 105. Accordingly, the additional implant regions contact at least one of isolation structure 130-3 (e.g., the third sidewall of the second isolation structure corresponding to sidewall 130-3S1 illustrated in FIG. 1B) or the isolation structure 130-1 (e.g., the second sidewall of the isolation structure corresponding to the sidewall 130-1S2 illustrated in FIG. 1B). As discussed previously, the additional implant regions (e.g. one or more second implant regions corresponding to implant regions 134-1A and 134-3A illustrated in FIG. 1B) have a corresponding dopant concentration (i.e., a second dopant concentration) greater than the bulk dopant concentration of the semiconductor substrate 105 but less than the implant region extending from a different sidewall of the isolation structure 130-1 (e.g., the first implant region corresponding to 132-1D extending from the first sidewall corresponding to 130-1S5 illustrated in FIG. 1E or any other implant region included in embodiments of the disclosure labeled as 132-1, 132-2, or 132-3).

In some embodiments, the transfer gate electrode 115 corresponds to a first gate electrode and the source-follower gate electrode 117 or the reset gate electrode 119 correspond to a second gate electrode. In such embodiments, one or more implant regions disposed between the transfer gate electrode 115 and the second side 109 of the semiconductor substrate 105 (e.g., 132-1B and 132-2B illustrated in FIG. 1C and 132-1D illustrated in FIG. 1E) may correspond to a first implant region while one or more other implant regions opposite to the first implant region (e.g., 134-1B and 134-2B illustrated in FIG. 1C and 134-1D illustrated in FIG. 1E) may correspond to a second implant region that is not disposed under the gate electrode (i.e., the transfer gate electrode 115).

It is appreciated that embodiments of the present disclosure may include one or more dielectric or insulating materials (e.g., the isolation structures 130, the gate dielectrics 127, and so on), which may have a composition including one or more dielectric materials. In some embodiments, the one or more dielectric materials may include oxides, nitrides, and/or silicates such as silicon dioxide ($SiO_2$), hafnium oxide ($HfO_2$), hafnium silicate ($HfSi_xO_y$), nitride hafnium silicate (HfSiON), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), a combination thereof, or the like. Additionally, one skilled in the relevant art, will recognize that any stoichiometric combination of the above metals/semiconductors and their oxides/nitrides/oxynitrides may be used, in accordance with embodiments of the present disclosure.

Figure 2A:
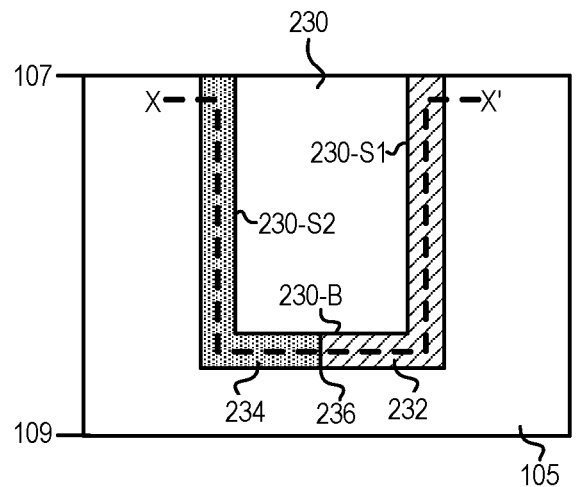
FIG. 2A illustrates a cross-sectional view of an example isolation with structure asymmetric passivation, in accordance with embodiments of the present disclosure.

FIG. 2A illustrates a cross-sectional view of an isolation structure 230 with asymmetric passivation, in accordance with embodiments of the present disclosure. The isolation structure 230 is disposed within the semiconductor substrate 105 and extends from the first side 107 towards the second side 109. As illustrated, the isolation structure 230 includes sidewall 230-S1 and sidewall 230-S2 opposite of the sidewall 230-S1. The isolation structure 230 further includes bottom surface 230-B coupled to sidewall 230-S1 and sidewall 230-S2. Contacting, or otherwise disposed proximate to, the isolation structure 230 are implant regions 232 and 234. More specifically, the implant region 232 contacts or extends from both the sidewall 230-S1 and the bottom surface 230-B without contacting the sidewall 230-S2. Additionally, the implant region 234 contacts or extends from both the sidewall 230-S2 and the bottom surface 230-B without contacting the sidewall 230-S1. Accordingly, the bottom surface 230-B is disposed between the first side 107 of the semiconductor substrate 105 and both of the implant regions 232A and 234. As illustrated, the implant regions 232 and 234 also interface one another (and in some embodiments, partially overlap) at interface 236. However, in other embodiments the implant regions 232 and 234 may not interface with one another. In the illustrated embodiment, the implant regions 232 and 234 are regions of the semiconductor substrate 105 that have different dopant concentrations to form an asymmetric doping profile. In most embodiments, a dopant concentration of the implant region 232 is greater than a dopant concentration of the implant region 234. In one embodiment, an average dopant concentration of the implant region 232 is greater than an average dopant concentration of the implant region 234. In some embodiments, an average of dopant concentration of the implant region 234 is greater than a dopant concentration of the semiconductor substrate 105 (e.g., the bulk dopant concentration). In some embodiments, the dopant concentration of the implant region 234 corresponds to the bulk dopant concentration of the semiconductor substrate 105.

It is appreciated that the isolation structure 230 illustrated in FIG. 2A may correspond to or otherwise describe features of any of the isolation structures 130 illustrated in FIGS. 1A-1E. In other words, the isolation structure 230 is one possible implementation of isolation structure 130-1, 130-2, and/or 130-3. Similarly, the implant regions 232 and 234 are possible implementations of similarly named implant regions illustrated in FIGS. 1A-1E (e.g., one or more of the implant regions 132 and 134, respectively) and thus may have the same or similar features, dopant concentrations, and the like. Accordingly, it is appreciated that the asymmetric doping profile formed by the implant regions 232 and 234 may similarly describe the asymmetric doping profile formed by the various embodiments of implant regions 132 and 134 illustrated in FIGS. 1A-1E. In other words, the asymmetric doping profile associated with the implant regions 232 and 234 may similarly describe the asymmetric doping profile formed by the implant regions 132 and 134 illustrated in FIGS. 1A-1E.

Figure 2B:
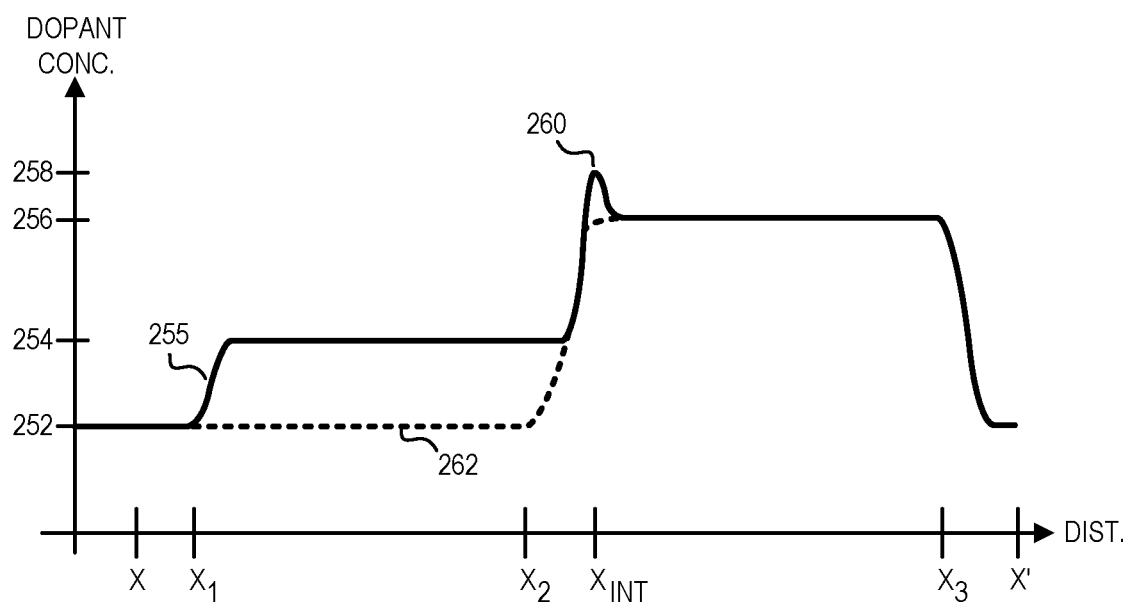
FIG. 2B illustrates a chart representative of an example doping profile of the example isolation structure shown in FIG. 2A, in accordance with embodiments of the present disclosure.

FIG. 2B illustrates a chart 250 representative of an example doping profile along the line X-X' of the example isolation structure shown in FIG. 2A, in accordance with embodiments of the present disclosure. It is appreciated that the chart 250 is an idealized chart in which a distance of a given point along line X-X' to a nearest surface point of the isolation structure 230 is equal across the length of line X-X'. It is appreciated that dopant concentration from ion implantation is highly dependent on implant energy, distance into the semiconductor substrate 105, and generally has a Gaussian distribution when measuring successively deeper into the semiconductor substrate from a surface point of the isolation structure 230. For ease of illustration and explanation, the line X-X' is equidistant from the isolation structure 230 and/or otherwise corresponds to a position within the semiconductor substrate 105 (or more specifically within the implant regions 232 and 234) where the dopant concentration corresponds to a local maximum.

Referring back to FIG. 2B, the chart 250 illustrates positions labeled X, $X_1$, $X_2$, $X_{INT}$, $X_3$, and X' along the distance axis ("DIST.") and dopant concentrations annotated at levels labeled 252, 254, 256, and 258 along the dopant concentration axis ("DOPANT CONC."). Position X and X' correspond to positions within the semiconductor substrate 105 that are along line X-X' that are outside of the implant regions 232 and 234, which have dopant concentrations corresponding to level 252, which is the bulk dopant concentration of the semiconductor substrate 105. The distance position $X_1$ is proximate to where the line X-X' enters the implant region 234, which increases from the bulk dopant concentration of the semiconductor substrate 105 (i.e., level 252) to a peak dopant concentration of the implant region 234 corresponding to level 254. However, it is appreciated that in other embodiments, the dopant concentration of the implant region 234 may correspond to the bulk dopant concentration of the semiconductor substrate 105, which is indicated by the dashed line 262. In such an embodiment, the dopant concentration along line X-X' remains substantially at the bulk dopant concentration of the semiconductor substrate 105 (i.e., at level 252) until reaching position $X_2$, which corresponds to or is otherwise proximate to where the line X-X' enters the implant region 232. $X_{INT}$ corresponds to the interface where the implant regions 234 and 232 interface, which may, in some embodiments, overlap one another such that a local peak 260 of dopant concentration at level 258 occurs. It is appreciated that the local peak 260 may not necessarily occur in all embodiments, such as when there is no overlap between the implant regions 234 and 232 and/or the dopant concentration for the implant region 234 corresponds to the bulk dopant concentration of the semiconductor substrate 105. It is further appreciated that the dopant concentration transition between the implant region 232 and the implant region 234 may be gradual. From the distance position $X_{INT}$ towards the position $X_3$, the dopant concentration corresponds to a peak dopant concentration of the implant region 232 corresponding to level 256. Finally, as the position along line X-X' exits the implant region 232 and enters the semiconductor substrate 105, the dopant concentration from $X_3$ to X' decreases to the bulk dopant concentration of the semiconductor substrate 105.

It is appreciated that the dopant concentrations represented by levels 252, 254, and 256 may be one or more orders, two or more orders, or more orders of magnitude different from one another. For example, the dopant concentration of the implant region 232 (e.g., at level 256) may be one, two, or more orders of magnitude greater than the dopant concentration of the implant region 234 (e.g., level 254 or 252). Similarly, the dopant concentration of the implant region 234 may be one, two, or more orders of magnitude greater than the bulk dopant concentration of the semiconductor substrate 105 (e.g., level 252). In some embodiments, the dopant concentration of the implant region 232 may be referred to as a first dopant concentration and the dopant concentration of the implant region 234 may be referred to a second dopant concentration (e.g., the first dopant concentration is greater than the second dopant concentration). It is appreciated that the asymmetric doping profile illustrated in FIG. 2B for the implant regions 232 and 234 illustrated in FIG. 2A may reduce white pixel and dark current without degrading RTS noise of pixel transitions (e.g., when the implant region 232 is positioned proximate to a photodiode or floating diffusion and the implant region 234 is proximate to gate of a source-follower transistor or other pixel transistors such as a reset transistor or a row select transistor).

Figure 3:
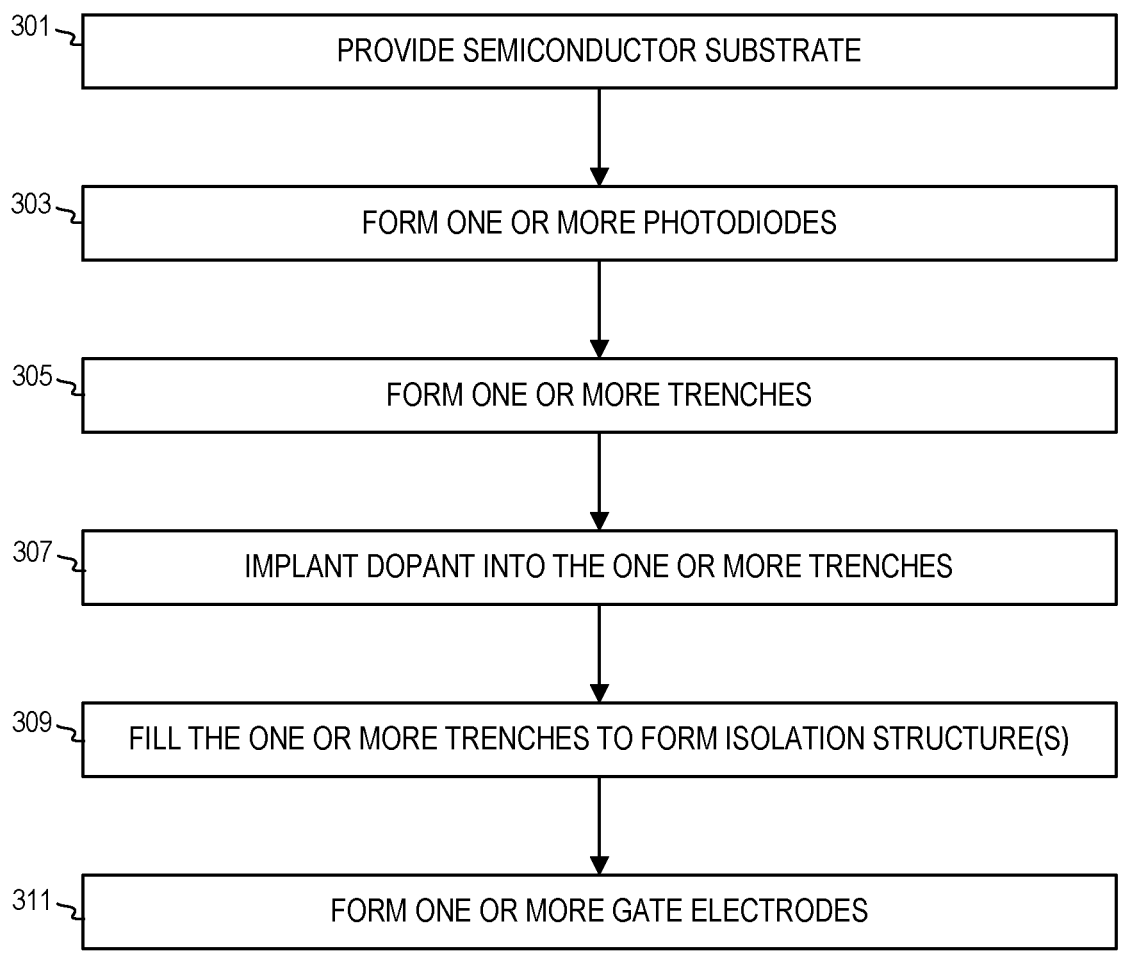
FIG. 3 illustrates a method for forming an isolation structure with asymmetric passivation, in accordance with embodiments of the present disclosure.

FIG. 3 illustrates method 300 for forming an isolation structure with asymmetric passivation, in accordance with embodiments of the present disclosure. It is appreciated that method 300 is one possible way in which the isolation structures 130 and 230 illustrated in FIGS. 1A-2A may be formed or otherwise manufactured. It is appreciated that while the process blocks of the method 300 illustrated in FIG. 3 are provided in a specific order, in other embodiments a different order of blocks 301, 303, 305, 307, 309, and 311 may be utilized. Additionally, process blocks may be added to, or removed from, the method 300 in accordance with the embodiments of the present disclosure. The process blocks illustrated in the method 300 may utilize conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, and the like. It is appreciated that the described techniques are merely demonstrative and not exhaustive and that other techniques may be utilized to fabricate one or more components of various embodiments of the disclosure.

Block 301 illustrates providing a semiconductor substrate (e.g., the semiconductor substrate 105 illustrated in FIG. 1A-2A) that may be used to form an image sensor or other complementary metal-oxide semiconductor device. It is appreciated that the semiconductor substrate may be provided to one or more machines or other pieces of equipment for fabrication (e.g., for applying one or more conventional semiconductor device processing and microfabrication techniques). In some embodiments, the semiconductor substrate may be an intrinsic or extrinsic semiconductor wafer or a wafer substrate having epitaxial layer grown thereon that may be prepopulated with one or more components (e.g., photodiodes), structures (e.g., wells), or the like.

Block 303 shows forming one or more photodiodes within the semiconductor substrate between a first side and a second side of the semiconductor substrate (see, e.g., photodiode 110 illustrated in FIG. 1A, FIG. 1B, and FIG. 1E) by one or more ion implantation process with various ion implementation energies to form one or more photodiodes with a specific doping profile. It is appreciated that in some embodiments the first and second sides opposite of one another may respectively correspond to a front side and a backside of the semiconductor substrate or vice versa.

Block 305 illustrates forming one or more trenches disposed within the semiconductor substrate. In some embodiments, the one or more trenches extend from the first side into the semiconductor substrate and towards the second side. At least one trench included in the one or more trenches is formed proximate to at least one of the one or more photodiodes. It is appreciated that in most embodiments, the trenches do not fully extend through the semiconductor substrate. However, in other embodiments, the trenches may fully extend through the semiconductor substrate. It is appreciated that the one or more trenches may form an initial cavity from which one or more isolation structures (e.g., the isolation structures 130 and/or 230 illustrated in FIGS. 1A-2A).

Block 307 shows implanting dopants at a non-normal angle (see, e.g., FIG. 4C and FIG. 4D) from the first side of the semiconductor substrate into one or more of the trenches. It is appreciated that block 307 may include one or more implantations to respectively form one or more implant regions (e.g., the implant regions 132 and 134 of FIGS. 1A-1E and the implant regions 232 and 234 of FIG. 2A). Accordingly, block 307 may include implanting dopants at a non-normal angle from the first side of the semiconductor substrate into the one or more the trenches and through respective trench to form a first implant region (e.g., implant regions 132 and 232 of FIGS. 1A-2A) in substrate regions of the semiconductor substrate proximate to each of the trenches and implanting second dopants at a second non-normal angle from the first side of the semiconductor substrate into the one or more trenches and through respective trench to form a second implant region (e.g., implant regions 134 and 234 of FIGS. 1A-2A) of the semiconductor substrate proximate to a sidewall of the respective trench. In some embodiments, the second non-normal angle is different from the non-normal angle. In one or more embodiments, a second dopant concentration of the second implant region is greater than the bulk dopant concentration of the semiconductor substrate but less than the first dopant concentration of the first implant region. In the same or other embodiments, the first dopant concentration of the first implant region is greater than a bulk dopant concentration of the semiconductor substrate. It is appreciated that implanting the dopants and the second dopants may be achieved via ion implantation with predetermined dosage rates. In some embodiments, implantation of the dopants to form the first implant region occurs at a first dosage rate and implantation of the second dopants to form the second implant region occurs at a second dosage rate. In the same or other embodiments, the first dosage rate is one order of magnitude, two orders of magnitude, or more orders of magnitude greater than the second dosage rate. It is appreciated that the first and second implant regions may provide an asymmetric doping profile around (e.g., surrounded, encapsulating, or otherwise disposed proximate to) sidewalls and bottoms of the trench associated with one or more of the isolation structures to provide advantages within the disclosure (e.g., passivate traps proximate to a photodiode or floating diffusion to reduce white pixel and dark currents without degrading RTS noise of pixel transistors).

Block 309 illustrates filling the one or more trenches with trench filling material (e.g., a dielectric material) to form one or more isolation structures (e.g., the isolation structures 130 and 230 illustrated in FIGS. 1A-2A) disposed within the semiconductor substrate and extending from the first side towards the second side. In some embodiments, at least one of the one or more of the isolation structures include a first sidewall, a second sidewall, and a bottom surface coupled to the first sidewall and the second sidewall. In some embodiments, the first sidewall is opposite of the second side wall. However, in other embodiments, the first and second sidewalls may be coupled to one another or otherwise disposed adjacent to each other. In some embodiments, the first implant region is disposed between one or more of the photodiodes and the first sidewall.

Block 311 shows forming one or more gate electrodes disposed proximate to the first side of the semiconductor substrate (e.g., the transfer gate electrode 115, the source-follower gate electrode 117, the reset gate electrode 119, or other gate electrodes associated with transistors included in an image sensor or as illustrated in FIGS. 1A-1E). In some embodiments, at least one of the one or more isolation structures is disposed, at least in part, between one of the gate electrodes and the second side of the semiconductor substrate.

FIGS. 4A-4D illustrate examples of angled implantation for forming the isolation structure with asymmetric passivation, in accordance with embodiments of the present disclosure. It is appreciated that the examples of angled implantation illustrated in FIGS. 4A-4D show non-limiting implementation details to form the implant regions illustrated and/or discussed in relation to FIGS. 1A-2B (e.g., implant regions 132, 134, 232, 234) and/or the implant regions discussed in method 300 illustrated in FIG. 3. It is appreciated that other orientations for ion implantation may be utilized and that the example embodiments are not exhaustive.

Figure 4A:
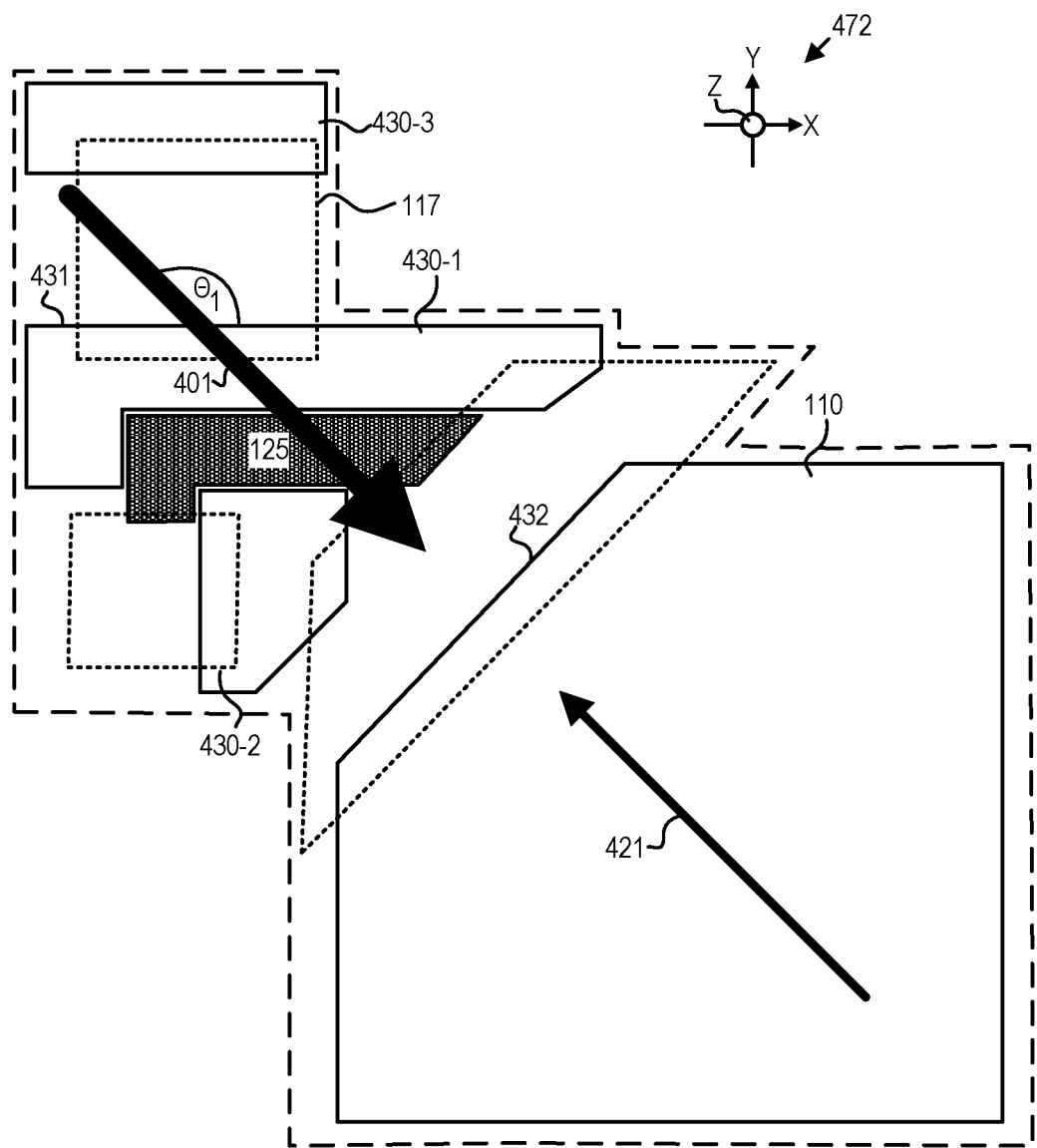
FIGS. 4A-4D illustrate examples of angled implantation for forming the isolation structure with asymmetric passivation, in accordance with embodiments of the present disclosure.
Figure 4B:
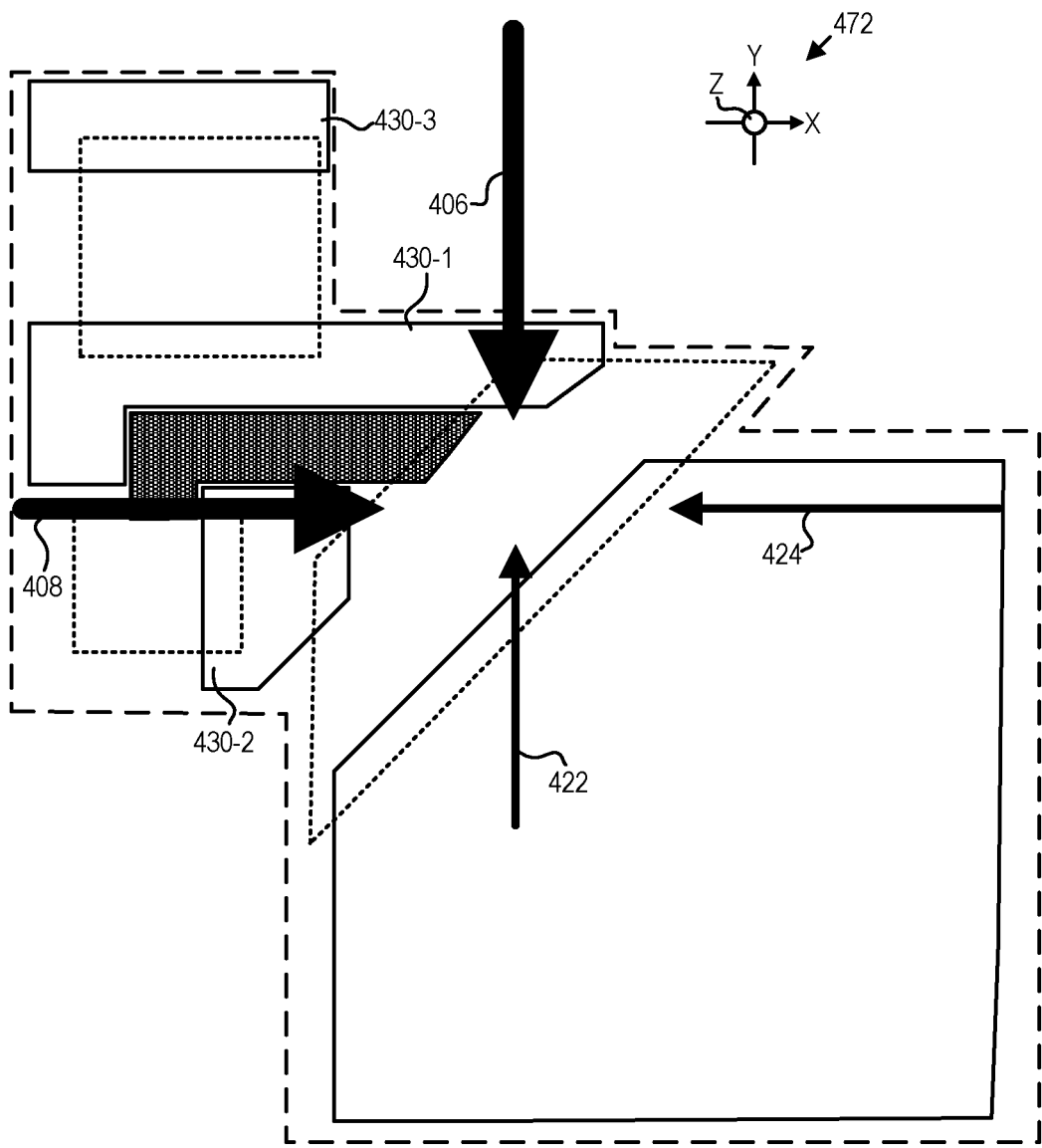

FIGS. 4A-4B illustrate an intermediate step for forming the example pixel 101 illustrated in FIG. 1A and include many like-labeled elements such as photodiode 110. FIGS. 4A and 4B illustrate trenches 430, trench 430-1, trench 430-2, and trench 430-3, which may subsequently be utilized to form the isolation structures 130 illustrated in FIG. 1A in accordance with method 300 illustrated in FIG. 3. Additionally, it is appreciated that not all elements are labeled (e.g., gate electrodes, floating diffusion regions and the like) or illustrated since said elements may be formed after the implant regions or otherwise may obscure certain features of the drawings. For example, it is appreciated that in most embodiments, ion implantation for the implant regions occurs before formation of gate electrodes and backfilling of trenches that are to form the isolation structures 130 (see, e.g., method 300 illustrated in FIG. 3). FIGS. 4A-4B further illustrate coordinate system 472 showing the X-Y plane as corresponding to the top view of the pixel 100 illustrated in FIG. 1A, and directions 401, 406, 408, 421, 422, and 424 illustrative of ion implantation directionality for forming implant regions with different implantation dosages and/or implantation energy to form the aforementioned implant regions. It is appreciated that the width of the directions 401, 406, 408, 421, 422, and 424 are indicative of implantation dosage. It is appreciated that in most, if not all embodiments, the directions 401, 406, 408, 421, 422, and 424 are directed into the page at a non-normal angle (see, e.g., FIG. 4C-4D).

Referring back to FIG. 4A, it can be seen that the ion implantation dosage along the direction 401 (e.g., to form the implant regions 132 and 232 illustrated in FIGS. 1A-2B) is greater than the implantation dosage along the direction 421 (e.g., to form the implant regions 134 and 234 illustrated in FIGS. 1A-2B). Additionally, in the illustrated embodiment, projection of the directions 401 and 421 onto the X-Y plane are parallel to one another but opposite in direction, which is perpendicular to an edge 432 of the photodiode 110. It is appreciated that the edge 432 of the photodiode 110 is the closest edge of the photodiode to the floating diffusion region 125 and/or one or more of the gate electrodes to be formed in subsequent steps (e.g., the source-follower gate electrode 117) to provide the benefits of the asymmetric doping profile discussed herein. However, in other embodiments, the projection of the directions 401 and 421 onto the X-Y plane may not be parallel to the edge 432 of the photodiode 110. In the illustrated embodiment, the projection of the directions 401 and 421 onto the X-Y plane are also at an angle, $\theta_1$, to an edge 431 of the trench 430-1 closed to or otherwise expected to be disposed under the source-follower gate electrode 117. In some embodiments, $\theta_1$ is approximately 135 degrees with respect to the X-axis, but it is appreciated that $\theta_1$ may be other values and is dependent, at least in part, on the misorientation between the edge 432 of the photodiode 110 and the edge 431 of the trench 430-1, both of which are selected to achieve the benefit of the asymmetric doping profile provided by the implant regions.

FIG. 4B illustrates additional or alternative implantation steps, in which the implant regions may be formed with greater than two ion implantation steps illustrated in FIG. 4A. Specifically, FIG. 4B shows that any number of ion implantation steps may be utilized to form an asymmetric doping profile and thus may not limit the orientation of elements of the pixel (e.g., photodiode, gate electrodes, isolation structures, floating diffusion regions, and the like). As illustrated, FIG. 4B shows directions 406, 408, 422, and 424, which may be utilized to form one, two, or more implant regions that have differing dopant concentrations based, at least in part, on implantation angle, implantation dosage, and/or implantation energy. As illustrated, the implantation dosages of directions 406 and 408 are greater than the implantation dosages of directions 422 and 424. In the illustrated embodiment, the projection of the directions 406 and 422 onto the X-Y plane are parallel to one another but opposite in direction. Similarly, the projection of the directions 408 and 424 onto the X-Y plane are parallel to one another but opposite in direction while also respectively being orthogonal to the projection of the directions 406 and 422. It is appreciated that the directionality, implant dosage, and implant energy of directions 406, 408, 422, and 424 may be configured to implant through the trenches 430 to form the implant regions illustrated in various embodiments of the disclosure. Additionally, it is appreciated that more or less implantation steps may be utilized when forming the implant regions than what is explicitly illustrated.

Figure 4C:
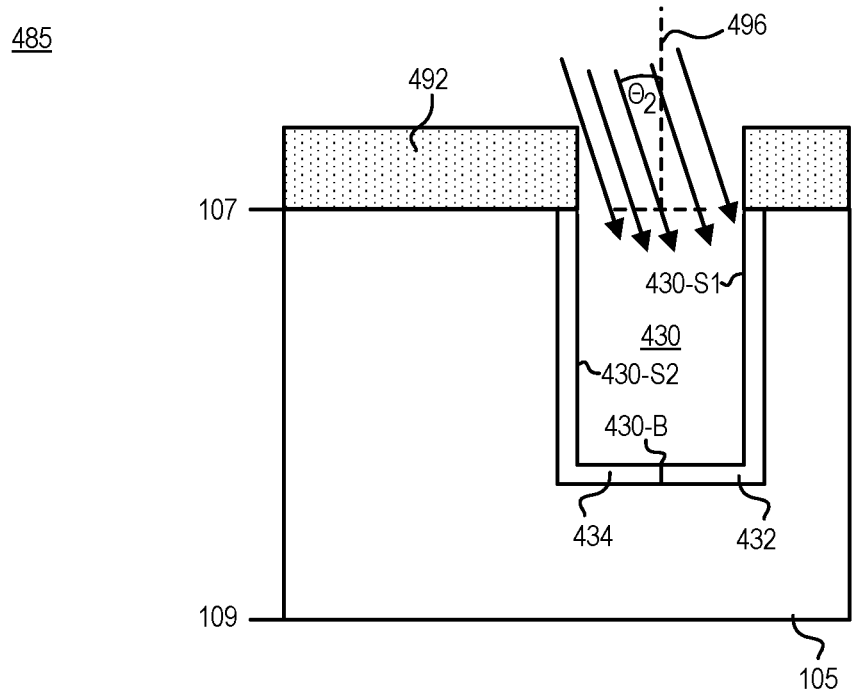

FIG. 4C illustrates a side view 485 of the intermediate step illustrated in FIG. 4A, in which ion implantation is directed through the isolation structures 430 along the direction 401, in accordance with an embodiment of the present disclosure. Specifically, the side view 485 of FIG. 4C corresponds to a cross-section taken along the z-direction of the coordinate system 472 illustrated in FIG. 4A that is along the X-Y projection of the direction 401. As illustrated, implanting dopants at a non-normal angle, $\theta_2$, relative to a normal axis 496 of the first side 107 surface of the semiconductor substrate 105, results in the implant region 432 contacting both a first sidewall 430-S1 and the bottom surface 430-B of the trench 430 without contacting the second sidewall 430-S2 of the isolation structure 430, which is due, at least in part a shadowing effect from the angle $\theta_2$ and mask 492.

Figure 4D:
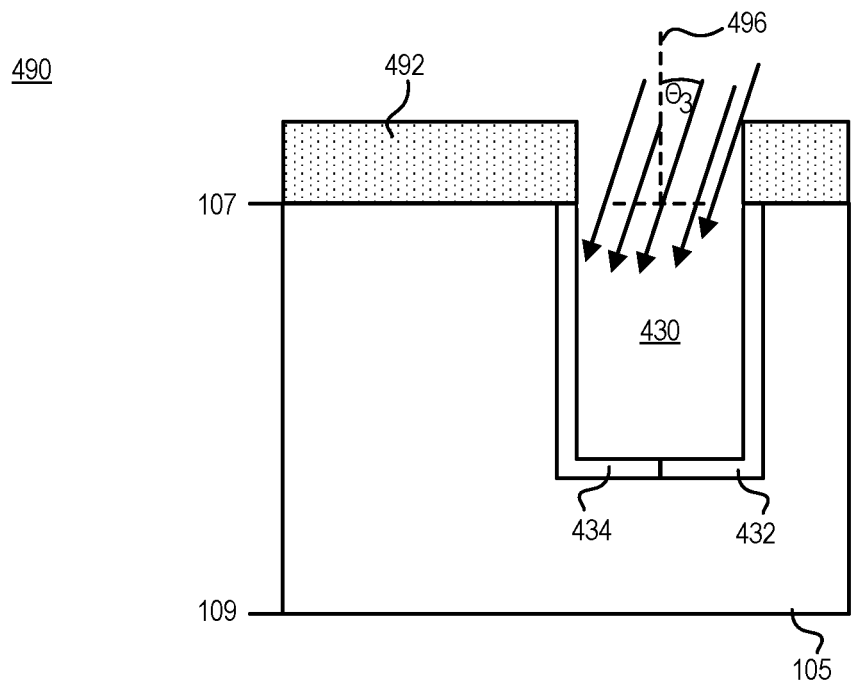

FIG. 4D illustrates a side view 490 of the intermediate step illustrated in FIG. 4A, in which ion implantation is directed through the isolation structures 430 along the direction 421, in accordance with an embodiment of the present disclosure. Specifically, the side view 490 of FIG. 4D corresponds to a cross-section taken along the z-direction of the coordinate system 472 illustrated in FIG. 4A that is along the X-Y projection of the direction 421. As illustrated, implanting dopants at a non-normal angle, $\theta_3$, relative to the normal axis 496 of the first side 107 surface of the semiconductor substrate 105, results in the implant region 434 contacting both the second sidewall 430-S2 and the bottom surface 430-B of the trench 430 without contacting the first sidewall 430-S1 of the isolation structure 430, which is due, at least in part a shadowing effect from the angle $\theta_3$ and mask 492. It is appreciated that in some embodiments $\theta_2$ and $\theta_3$ are opposite one another (e.g., if $\theta_2$ is −X degrees relative to the surface normal then $\theta_3$ is +X degrees relative to the surface normal).

Figure 5:
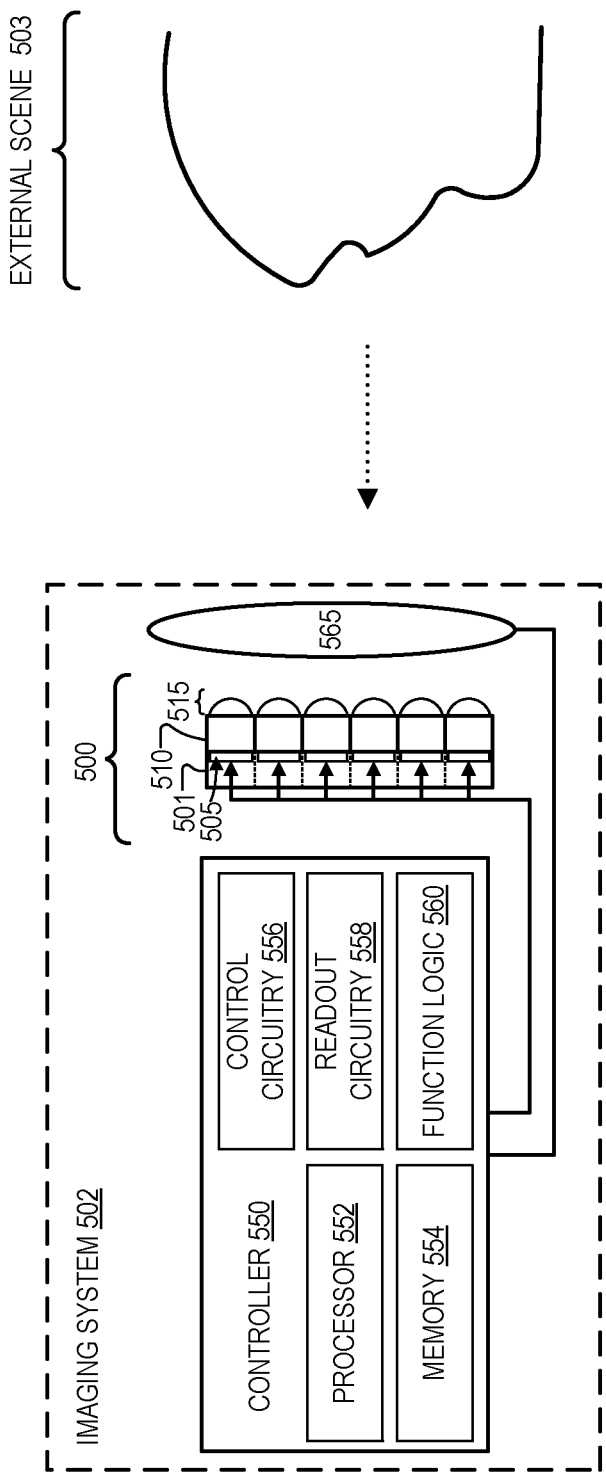
FIG. 5 illustrates an example imaging system including an image sensor with one or more isolation structures having asymmetric passivation, in accordance with embodiments of the present disclosure.

FIG. 5 illustrates an example imaging system 502 including an image sensor 500 with one or more isolation structures having asymmetric passivation, in accordance with embodiments of the present disclosure. The image sensor 500 may include a plurality of pixels, each corresponding to instances of the pixel 101 illustrated in FIG. 1A-1E, which are further described in FIG. 2A-2B, in accordance with embodiments of the present disclosure. The imaging system 502 includes image sensor 500 to generate electrical or image signals in response to incident radiation 570, objective lens(es) 565 with adjustable optical power to focus on one or more points of interest within the external scene 503, and controller 550 to control, inter alia, operation of image sensor 500 and objective lens(es) 565. Image sensor 500 is a simplified schematic showing a semiconductor material 501 with a plurality of photodiodes 505 disposed within respective portions of the semiconductor material 501, a plurality of color filters 510, and a plurality of micro-lenses 515. The controller 550 includes one or more processors 552, memory 554, control circuitry 556, readout circuitry 558, and function logic 560.

The controller 550 includes logic and/or circuitry to control the operation (e.g., during pre-, post-, and in situ phases of image and/or video acquisition) of the various components of imaging system 502. The controller 550 can be implemented as hardware logic (e.g., application specific integrated circuits, field programmable gate arrays, system-on-chip, etc.), software/firmware logic executed on a general-purpose microcontroller or microprocessor, or a combination of both hardware and software/firmware logic. In one embodiment, the controller 550 includes the processor 552 coupled to memory 554 that stores instructions for execution by the controller 550 and/or one or more other components of the imaging system 502. The instructions, when executed, can cause the imaging system 502 to perform operations associated with the various functional modules, logic blocks, or circuitry of the imaging system 502 including any one of, or a combination of, the control circuitry 556, the readout circuitry 558, the function logic 560, image sensor 500, objective lens 565, and any other element of imaging system 502 (illustrated or otherwise). The memory is a non-transitory computer-readable medium that can include, without limitation, a volatile (e.g., RAM) or non-volatile (e.g., ROM) storage system readable by controller 550. It is further appreciated that the controller 550 can be a monolithic integrated circuit, one or more discrete interconnected electrical components, or a combination thereof. Additionally, in some embodiments one or more electrical components can be coupled together to collectively function as controller 550 for orchestrating operation of the imaging system 502.

Control circuitry 556 can control operational characteristics of the photodiode array 505 (e.g., exposure duration, when to capture digital images or videos, and the like). Readout circuitry 558 reads or otherwise samples the analog signal from the individual photodiodes (e.g., read out electrical signals generated by each of the plurality of photodiodes 505 in response to incident light to generate image signals for capturing an image frame, and the like) and can include amplification circuitry, analog-to-digital (ADC) circuitry, image buffers, or otherwise. In the illustrated embodiment, readout circuitry 558 is included in controller 550, but in other embodiments readout circuitry 558 can be separate from the controller 550. Function logic 560 is coupled to the readout circuitry 558 to receive image data to de-mosaic the image data and generate one or more image frames. In some embodiments, the electrical signals and/or image data can be manipulated or otherwise processed by the function logic 560 (e.g., apply post image effects such as crop, rotate, remove red eye, adjust brightness, adjust contrast, or otherwise).

Spatially relative terms, such as "beneath," "below," "over," "under," "above," "upper," "top," "bottom," "left," "right," "center," "middle," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device can be otherwise oriented (rotated ninety degrees or at other orientations) and the spatially relative descriptors used herein are interpreted accordingly. In addition, it will also be understood when an element is referred to as being "between" two other elements, it can be the only element between the two other elements, or one or more intervening elements can also be present.

The processes explained above can be implemented using software and/or hardware. The techniques described can constitute machine-executable instructions embodied within a tangible or non-transitory machine (e.g., computer) readable storage medium, when executed by a machine (e.g., controller 550 of FIG. 5) will cause the machine to perform the operations described. Additionally, the processes can be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel for an image sensor, the pixel comprising:
   a photodiode disposed within a semiconductor substrate between a first side and a second side of the semiconductor substrate, the second side opposite the first side;
   an isolation structure disposed within the semiconductor substrate and extending from the first side towards the second side, wherein the isolation structure includes a first sidewall, a second sidewall, and a bottom surface coupled to the first sidewall and the second sidewall;
   a gate electrode disposed proximate to the first side of the semiconductor substrate, wherein the isolation structure is disposed, at least in part, between the gate electrode and the second side of the semiconductor substrate; and
   a first implant region of the semiconductor substrate disposed proximate to the first sidewall of the isolation structure, wherein the first implant region is further disposed between the photodiode and the first sidewall, and wherein a first dopant concentration of the first implant region is greater than a bulk dopant concentration of the semiconductor substrate,
   wherein the first implant region is further disposed proximate to the bottom surface of the isolation structure without contacting the second sidewall of the isolation structure such that the bottom surface is disposed between the first implant region and the first side of the semiconductor substrate.

2. The pixel of claim 1, wherein a portion of the semiconductor substrate opposite the first implant region and proximate to the second sidewall has a same conductivity type as the first implant region and a respective dopant concentration corresponding to the bulk dopant concentration of the semiconductor substrate.

3. The pixel of claim 2, wherein the first dopant concentration is at least one order of magnitude greater than the respective dopant concentration of the portion of the semiconductor substrate such that there is an asymmetric doping profile around the isolation structure based on a difference between the first dopant concentration and the bulk dopant concentration.

4. The pixel of claim 1, further comprising a second implant region of the semiconductor substrate proximate to the second sidewall of the isolation structure, wherein the first implant region is disposed between the photodiode and the second implant region, and wherein a second dopant concentration of the second implant region is greater than the bulk dopant concentration of the semiconductor substrate but less than the first dopant concentration of the first implant region.

5. The pixel of claim 4, wherein the second implant region contacts both the second sidewall and the bottom surface of the isolation structure without contacting the first sidewall of the isolation structure.

6. The pixel of claim 4, wherein the first dopant concentration is one or more orders of magnitude greater than the second dopant concentration such that there is an asymmetric doping profile around the isolation structure based on a difference between the first dopant concentration and the second dopant concentration.

7. The pixel of claim 1, wherein the first implant region is disposed, at least in part, between the gate electrode and the second side of the semiconductor substrate.

8. The pixel of claim 7, further comprising a second implant region of the semiconductor substrate proximate to the second sidewall of the isolation structure, wherein the first implant region is further disposed between the photodiode and the second implant region, wherein the isolation structure is further disposed between an edge of the gate electrode and the second side of the semiconductor substrate such that the gate electrode does not extend over at least a portion of the second implant region.

9. The pixel of claim 8, wherein the first implant region contacts both the first sidewall and the bottom surface of the isolation structure without contacting the second sidewall of the isolation structure, wherein the second implant region contacts both the second sidewall and the bottom surface of the isolation structure without contacting the first sidewall of the isolation structure, and wherein a second dopant concentration of the second implant region is greater than the bulk dopant concentration of the semiconductor substrate but less than a first dopant concentration of the first implant region.

10. The pixel of claim 1, further comprising a second gate electrode disposed proximate to the first side of the semiconductor substrate, wherein the second sidewall of the isolation structure is disposed between the second gate electrode and the second side of the semiconductor substrate.

11. The pixel of claim 10, wherein the gate electrode corresponds to a transfer gate electrode of a transfer transistor coupling the photodiode to a floating diffusion disposed in the semiconductor substrate, and wherein the second gate electrode corresponds to a reset gate electrode of a reset transistor or a source-follower gate electrode of a source-follower transistor.

12. The pixel of claim 10, wherein the first implant region contacts both the first sidewall and the bottom surface of the isolation structure without contacting the second sidewall of the isolation structure, and wherein a portion of the semiconductor substrate opposite the first implant region and contacting the second sidewall has a respective dopant concentration corresponding to the bulk dopant concentration of the semiconductor substrate.

13. The pixel of claim 10, further comprising a second implant region of the semiconductor substrate disposed proximate to the second sidewall of the isolation structure, wherein the first implant region is disposed between the photodiode and the second implant region, wherein a second dopant concentration of the second implant region is greater than the bulk dopant concentration of the semiconductor substrate but less than the first dopant concentration of the first implant region, and wherein the second implant region is disposed between the second gate electrode and the second side of the semiconductor substrate.

14. The pixel of claim 10, further comprising a second isolation structure disposed within the semiconductor substrate and extending from the first side towards the second side, wherein the isolation structure is disposed between the photodiode and the second isolation structure, wherein the second sidewall of the isolation structure is disposed between a third sidewall of the second isolation structure and the first implant region, and wherein the third sidewall is disposed between the second gate electrode and the second side of the semiconductor substrate.

15. The pixel of claim 14, further comprising a second implant region of the semiconductor substrate disposed between the second gate electrode and the second side of the semiconductor substrate, and wherein the second implant region contacts the second sidewall of the isolation structure or the third sidewall of the second isolation structure, and wherein a second dopant concentration of the second implant region is greater than the bulk dopant concentration of the semiconductor substrate but less than the first dopant concentration of the first implant region.

16. The pixel of claim 1, wherein the gate electrode corresponds to a transfer gate electrode of a transfer transistor coupling the photodiode to a floating diffusion disposed in the semiconductor substrate, a reset gate electrode of a reset transistor, or a source-follower gate electrode of a source-follower transistor operative for reading out image charge from the photodiode.

17. A method for forming a pixel of an image sensor, the method comprising:
   forming a photodiode disposed within a semiconductor substrate between a first side and a second side of the semiconductor substrate, the first side opposite the second side;
   forming a trench disposed in the semiconductor substrate, the trench extending from the first side towards the second side;
   implanting dopants at a non-normal angle from the first side of the semiconductor substrate into the trench to form a first implant region of the semiconductor substrate proximate to the trench; and
   filling the trench to form an isolation structure disposed within the semiconductor substrate and extending from the first side towards the second side, the isolation structure including a first sidewall, a second sidewall, and a bottom surface coupled to the first sidewall and the second sidewall, and wherein the first implant region is disposed between the photodiode and the first sidewall, and wherein a first dopant concentration of the first implant region is greater than a bulk dopant concentration of the semiconductor substrate,
   wherein the non-normal angle of implanting the dopants results in the first implant region contacting both the first sidewall and the bottom surface of the isolation structure without contacting the second sidewall of the isolation structure.

18. The method of claim 17, further comprising implanting second dopants at a second non-normal angle from the first side of the semiconductor substrate into the trench to form a second implant region of the semiconductor substrate, wherein the second non-normal angle is different from the non-normal angle, and wherein implanting the second dopants results in the second implant region contacting both the second sidewall and the bottom surface of the isolation structure without contacting the first sidewall of the isolation structure, and wherein a second dopant concentration of the second implant region is greater than the bulk dopant concentration of the semiconductor substrate but less than the first dopant concentration of the first implant region.

19. The method of claim 18, wherein implanting the dopants to form the first implant region occurs at a first dosage rate and implanting the second dopants to form the second implant region occurs at a second dosage rate, wherein the first dosage rate is at least one order of magnitude greater than the second dosage rate.

20. The method of claim 17, further comprising forming a gate electrode disposed proximate to the first side of the semiconductor substrate, wherein the isolation structure is disposed, at least in part, between the gate electrode and the second side of the semiconductor substrate.

21. A pixel for an image sensor, the pixel comprising:
a photodiode disposed within a semiconductor substrate between a first side and a second side of the semiconductor substrate, the second side opposite the first side;
an isolation structure disposed within the semiconductor substrate and extending from the first side towards the second side, wherein the isolation structure includes a first sidewall, a second sidewall, and a bottom surface coupled to the first sidewall and the second sidewall;
a gate electrode disposed proximate to the first side of the semiconductor substrate, wherein the isolation structure is disposed, at least in part, between the gate electrode and the second side of the semiconductor substrate;
a first implant region of the semiconductor substrate disposed between the photodiode and the first sidewall, wherein the first implant region directly contacts the first sidewall;
a second implant region directly contacting the second sidewall, and wherein a first dopant concentration of the first implant region is greater than a second dopant concentration of the second implant region.

22. The pixel of claim 21, wherein the first implant region is disposed between the gate electrode and the second side of the semiconductor substrate or the second implant region is disposed between the gate electrode and the second side of the semiconductor substrate.

23. The pixel of claim 21, wherein the bottom surface of the isolation structure is disposed between the first side of the semiconductor substrate and at least one of the first implant region or the second implant region.

24. The pixel of claim 21, further comprising a second gate electrode disposed proximate to the first side of the semiconductor substrate, wherein the second sidewall of the isolation structure is disposed between the second gate electrode and the second side of the semiconductor substrate, wherein the first implant region is disposed between the gate electrode and the second side of the semiconductor substrate, and wherein the second implant region is disposed between the second gate electrode and the second side of the semiconductor substrate.

* * * * *